(12) United States Patent
Hong et al.

(10) Patent No.: US 8,245,393 B2
(45) Date of Patent: Aug. 21, 2012

(54) METHOD FOR FABRICATING A CIRCUIT BOARD INCLUDING ALIGNED NANOSTRUCTURES

(75) Inventors: Seung Hun Hong, Seoul (KR); Sung Myung, Daejeon (KR); Ju Wan Kang, Daegu (KR)

(73) Assignee: SNU R&DB Foundation, Seoul (KR)

( * ) Notice: Subject to any disclaimer, the term of this patent is extended or adjusted under 35 U.S.C. 154(b) by 642 days.

(21) Appl. No.: 12/234,529

(22) Filed: Sep. 19, 2008

(65) Prior Publication Data

US 2010/0032197 A1  Feb. 11, 2010

(30) Foreign Application Priority Data

Aug. 5, 2008 (KR) .................. 10-2008-0076382

(51) Int. Cl.
*H01K 3/00* (2006.01)
(52) U.S. Cl. ................ 29/850; 29/825; 29/827; 29/832; 29/846; 29/852
(58) Field of Classification Search ............ 29/827, 29/825, 842, 846, 850, 852, 832, 838; 977/883, 977/902, 856, 855, 901; 438/758, 468, 677, 438/763, 678, 681; 174/261
See application file for complete search history.

(56) References Cited

U.S. PATENT DOCUMENTS

| | | | |
|---|---|---|---|
| 6,027,958 A * | 2/2000 | Vu et al. ................ 438/110 |
| 6,918,284 B2 * | 7/2005 | Snow et al. ............. 73/31.05 |
| 7,052,588 B2 * | 5/2006 | Gu et al. ................ 204/403.01 |
| 7,232,771 B2 * | 6/2007 | Jacobs et al. ............ 438/758 |
| 7,696,022 B2 | 4/2010 | Ikeda |
| 7,906,380 B2 | 3/2011 | Ikeda |
| 2003/0068432 A1 * | 4/2003 | Dai et al. ................ 427/58 |
| 2004/0041154 A1 * | 3/2004 | Watanabe et al. ........ 257/77 |
| 2004/0166233 A1 | 8/2004 | Hong |
| 2005/0079659 A1 | 4/2005 | Duan et al. |
| 2008/0081535 A1 | 4/2008 | Perlo et al. |
| 2009/0173527 A1 | 7/2009 | Benke et al. |
| 2009/0265929 A1 | 10/2009 | Nakagawa et al. |

FOREIGN PATENT DOCUMENTS

| | | |
|---|---|---|
| CN | 1684566 | 10/2005 |
| JP | 2007-158117 | 6/2007 |
| JP | 2007-329351 | 12/2007 |
| KR | 10-2007-0112733 | 11/2007 |
| KR | 10-2008-0040241 | 5/2008 |
| KR | 10-2008-0069995 | 7/2008 |

(Continued)

OTHER PUBLICATIONS

A. Behnam et al., "Resistivity scaling in single-walled carbon nanotube films patterned to submicron dimensions", Applied Physics Letters 89, 093107, 2006.

(Continued)

*Primary Examiner* — Derris Banks
*Assistant Examiner* — Tai Nguyen
(74) *Attorney, Agent, or Firm* — Knobbe, Martens, Olson & Bear LLP

(57) ABSTRACT

A method for fabricating a circuit board includes providing a first substrate, forming a circuit on the first substrate, the circuit having a first electrode, a second electrode and at least one nanostructure, and transferring the circuit from the first substrate to a surface of a second substrate made of a polymer.

29 Claims, 25 Drawing Sheets

FOREIGN PATENT DOCUMENTS

WO    WO 2007/037381 A1    4/2007
WO    WO 2007/114649 A1    10/2007

OTHER PUBLICATIONS

M. Miller et al., "Large-scale assembly of carbon nanotubes", Nature, vol. 425, Sep. 4, 2003, p. 36-37.

Bradley et al. (2003). Flexible nanotube electronics. *Nano Lett.*, 3(10):1353-1355.

Jung et al. (2006). Aligned carbon nanotube—polymer hybrid architectures for diverse flexible electronic applications. *Nano Lett.*, 6(3):413-418.

Kang et al. (2008). Large-scale assembly of carbon nanotube-based flexible circuits for DNA sensors. *Nanotechnology*, 19:1-4.

Notice of Decision for Patent received in Korean Patent Application, KR 10-2008-0076382, dated Jul. 1, 2011.

Jackman, R.J., et al., "Using Elastomeric Membranes as Dry Resists and for Dry Lift-Off," *Langmuir* 1999, pp. 2973-2984, vol. 15, No. 8.

Lee, M. et al., "Linker-Free Directed Assembly of High-Performance Integrated Devices Based on Nanotubes and Nanowires," *Nature Nanotechnology* 1, 2006, pp. 66-71.

Myung, S. et al., "Large-Scale "Surface-Programmed Assembly" of Pristine Vanadium Oxide Nanowire-Based Devices," *Advanced Materials*, Oct. 2005, pp. 2361-2364, vol. 17, No. 19.

\* cited by examiner

FIG. 4
(a)
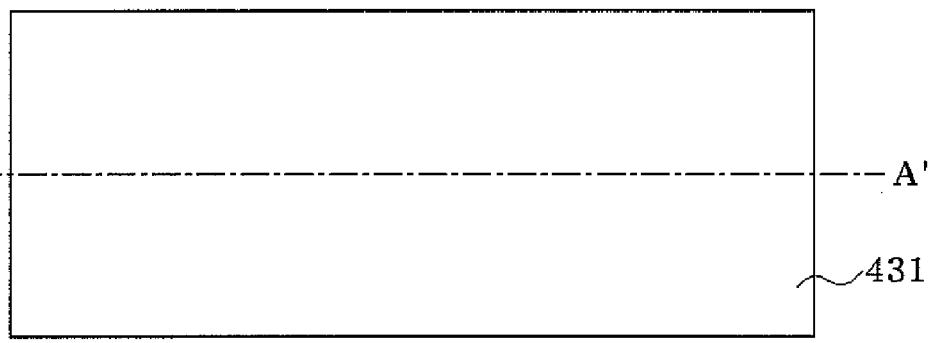
(b)

FIG. 12
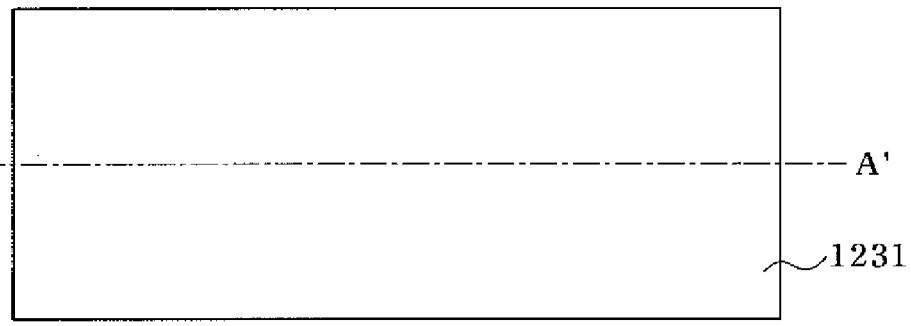
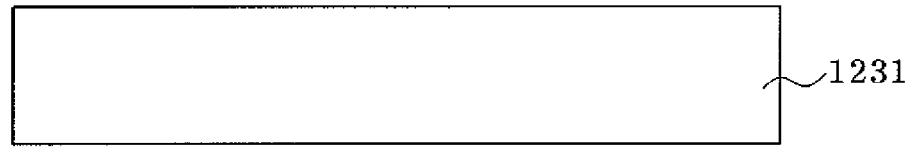

FIG. 18
(a) 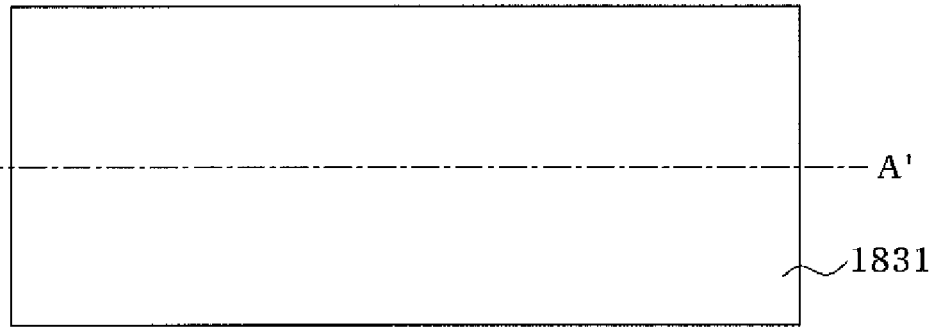
(b) 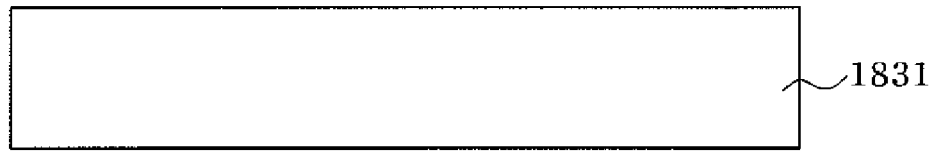

METHOD FOR FABRICATING A CIRCUIT BOARD INCLUDING ALIGNED NANOSTRUCTURES

CROSS-REFERENCE TO RELATED APPLICATIONS

This application claims priority under 35 U.S.C. §119 to Korean Patent Application No. 10-2008-0076382 filed on Aug. 5, 2008, the contents of which are herein incorporated by reference in their entirety.

TECHNICAL FIELD

The described technology relates generally to a circuit board including aligned nanostructures.

BACKGROUND

Recently, there is an increasing amount of interest in new devices based on nanostructures such as carbon nanotubes and nanowires. These devices which employ nano technology are being used in a variety of fields such as electronics, mechanics, optics, and biological engineering.

In particular, research into utilizing the superior electronic, mechanical and structural properties of carbon nanotubes in flexible electronics is underway. As examples of technology using carbon nanotubes in flexible electronics, Y. J. Jung, et al., 2006 Nano Lett. 6 413, and K. Bradley, et al., 2003 Nano Lett. 3 1353 disclose methods of making a composite of carbon nanotubes and polymer. However, carbon nanotubes are typically grown in a costly and time-consuming chemical vapor deposition (CVD) process, which prevents the cost-efficient mass production of flexible electronics.

SUMMARY

In one embodiment, a method for fabricating a circuit board includes providing a first substrate, forming a circuit on the first substrate, the circuit having a first electrode, a second electrode and at least one nanostructure, and transferring the circuit from the first substrate to a surface of a second substrate made of a polymer.

In another embodiment, a circuit board includes a polymer substrate, a first electrode and a second electrode disposed on a surface of the polymer substrate, and at least one nanostructure electrically connected to the first and second electrodes.

The Summary is provided to introduce a selection of concepts in a simplified form that are further described below in the Detailed Description. The Summary is not intended to identify key features or essential features of the claimed subject matter, nor is it intended to be used as an aid in determining the scope of the claimed subject matter.

BRIEF DESCRIPTION OF THE DRAWINGS

FIGS. 4 to 11 are plan views ((a) of FIGS. 4 to 11) and cross-sectional views ((b) of FIGS. 4 to 11) illustrating a method for fabricating a circuit board according to one embodiment.

FIGS. 12 to 17 are plan views ((a) of FIGS. 12 to 17) and cross-sectional views ((b) of FIGS. 12 to 17) illustrating a method for fabricating a circuit board according to another embodiment.

FIGS. 18 to 25 are plan views ((a) of FIGS. 18 to 25) and cross-sectional views ((b) of FIGS. 18 to 25) illustrating a method for fabricating a circuit board according to another embodiment.

DETAILED DESCRIPTION

Figure 1:
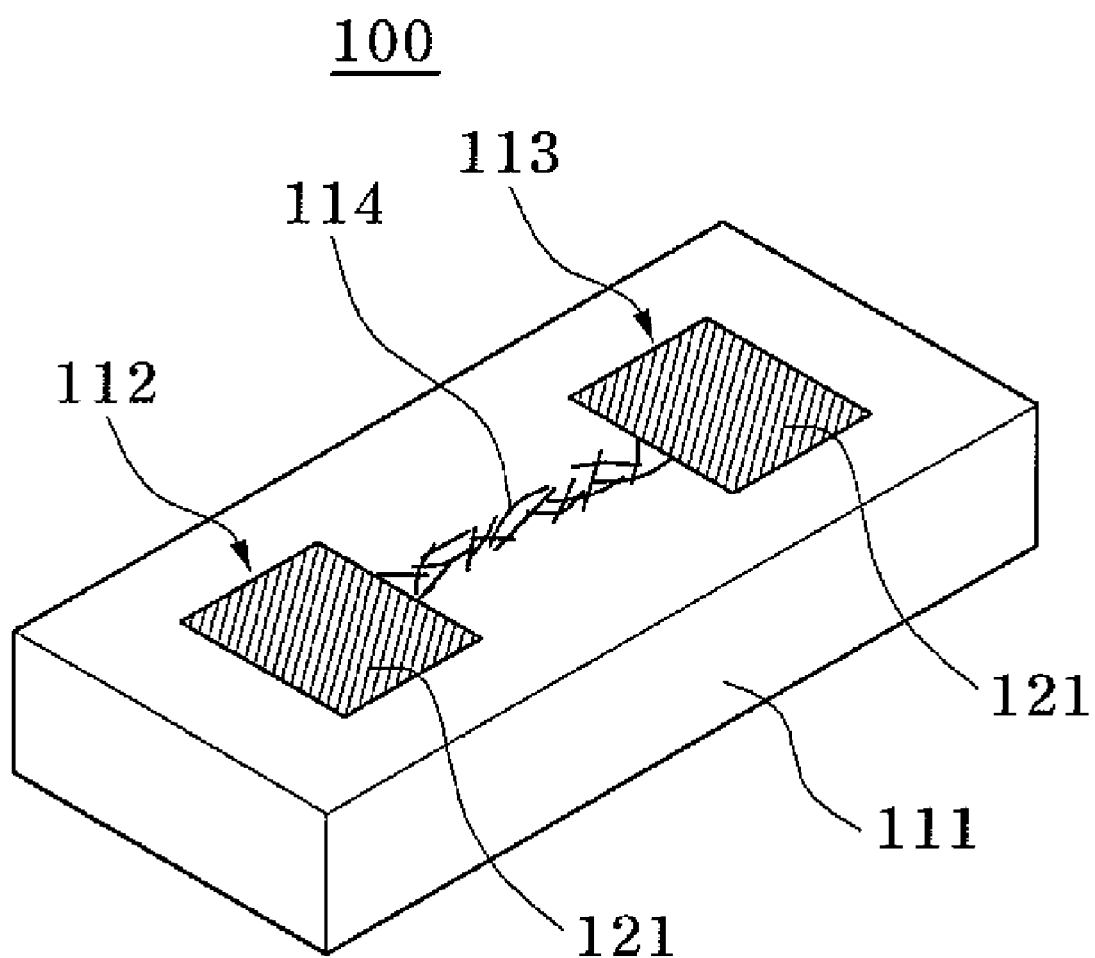
FIG. 1 is a perspective view of a circuit board according to one embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the components of the present disclosure, as generally described herein, and illustrated in the Figures, can be arranged, substituted, combined, and designed in a wide variety of different configurations, all of which are explicitly contemplated and make part of this disclosure.

It will also be understood that when an element or layer is referred to as being "on" or "connected to" another element or layer, the element or layer may be directly on or connected to the other element or layer or intervening elements or layers may be present.

Figure 2:
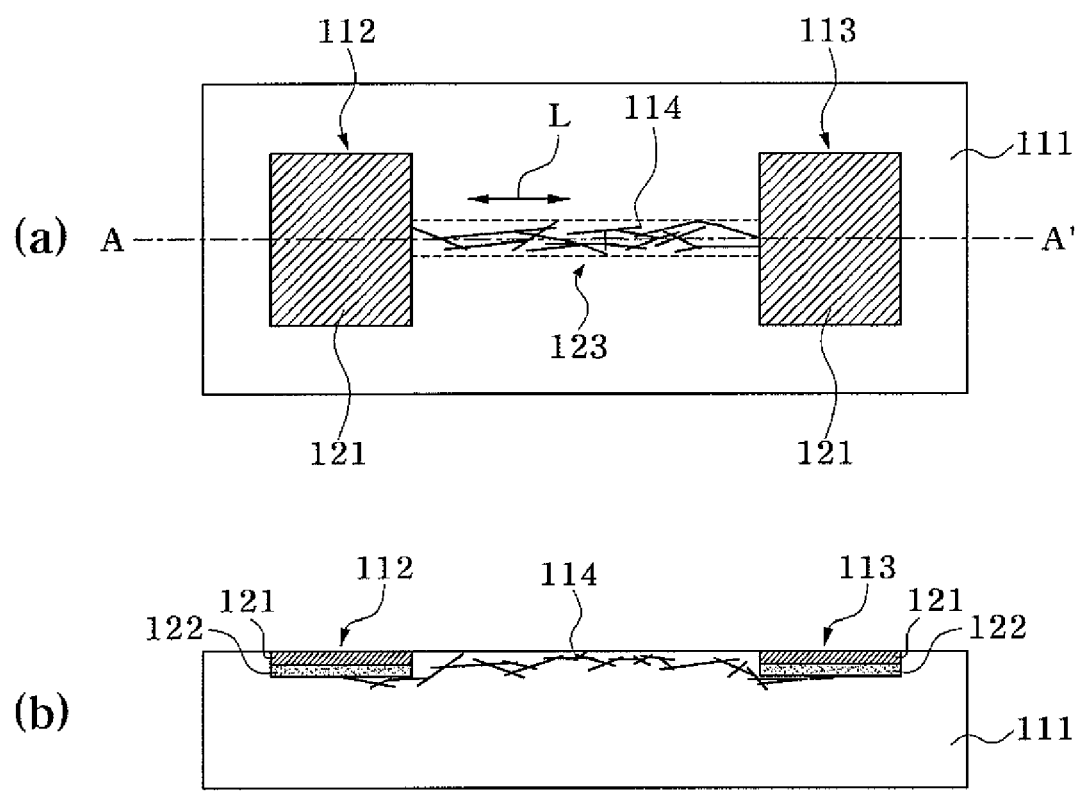
FIG. 2 is a plan view ((a) of FIG. 2) and a cross-sectional view ((b) of FIG. 2) of the circuit board shown in FIG. 1.

FIG. 1 is a perspective view of a circuit board according to one embodiment. FIG. 2 is a plan view ((a) of FIG. 2) and a cross-sectional view ((b) of FIG. 2) of the circuit board shown in FIG. 1. The cross-sectional view is taken from a line A-A' in the plan view. As illustrated in FIGS. 1 and 2, a circuit board 100 may include a polymer substrate 111, a first electrode 112, a second electrode 113 and at least one nanostructure 114.

The polymer substrate 111 may be, for example, a flexible substrate. The flexible substrate may be a silicon polymer substrate such as a polydimethylsiloxane (PDMS) substrate. PDMS is flexible, inert, nontoxic and incombustible, and thus may be a suitable material for bio-applications or other similar applications.

The first electrode 112 and the second electrode 113 are disposed on a surface of the polymer substrate 111. The first electrode 112 and the second electrode 113 may be disposed on the surface of the polymer substrate 111 in an arrangement in which portions of the respective first and second electrodes 112 and 113 are depressed in the polymer substrate 111, as shown in FIG. 1. In addition, although not shown, the first electrode 112 and the second electrode 113 may be disposed on the surface of the polymer substrate 111 in an arrangement in which portions of respective first and second electrodes 112 and 113 are disposed above the surface of the polymer substrate 111. The first and second electrodes 112 and 113 are conductors, and may include, for example, a metal or a doped polysilicon. Each of the first electrode 112 and the second electrode 113 may include a multilayer structure having a gold layer 121 and a palladium layer 122 as shown in FIG. 2. As illustrated in FIGS. 1 and 2, the first electrode 112 and the second electrode 113 are disposed above some of the at least one nanostructure 114; alternatively, the first electrode 112 and the second electrode 113 may be disposed below some of the at least one nanostructure 114.

The at least one nanostructure 114 is electrically connected to the first electrode 112 and the second electrode 113. FIGS.

1 and 2 illustrate the at least one nanostructure 114 connected to the first and second electrodes. The connection between the at least one nanostructure 114 and the first and second electrodes 112 and 113 is not limited to a case in which each of the at least one nanostructure 114 is directly connected to the first and second electrodes 112 and 113. To detail this, a portion of one nanostructure of the at least one nanostructure 114 may be electrically connected to the first electrode 112, a portion of another nanostructure of the at least one nanostructure 114 may be electrically connected to the second electrode 113, and the one nanostructure and the other nanostructure may be electrically connected to each other. In addition, a portion of one nanostructure of the at least one nanostructure 114 may be electrically connected to the first electrode 112, a portion of another nanostructure of the at least one nanostructure 114 may be electrically connected to the second electrode 113, and the one nanostructure and the other nanostructure may be electrically connected to each other via at least yet another nanostructure of the at least one nanostructure 114.

In one embodiment, the at least one nanostructure 114 may include, for example, a nanotube, a nanowire, or a nanorod, each having a linear structure. The nanotube may be a carbon nanotube. The nanowire and nanorod may be formed of various materials including a conductive polymer, vanadium oxide, indium oxide, zinc oxide, tin oxide, cadmium oxide, silicon, germanium, gallium nitride, or combinations thereof.

In one embodiment, the at least one nanostructure 114 may be aligned in a longitudinal direction L of a pattern 123 formed by the at least one nanostructure 114. The alignment of the at least one nanostructure 114 in the longitudinal direction L does not mean that all of the at least one nanostructure 114 are aligned in the longitudinal direction L. The alignment of the at least one nanostructure 114 in the longitudinal direction L excludes a case in which at least one nanostructure 114 is arbitrarily disposed. The alignment of the at least one nanostructure 114 in the longitudinal direction L means that the at least one nanostructure 114 is intentionally aligned in the longitudinal direction L. For example, when the number of nanostructure(s) having an angle of 45° or less with respect to the longitudinal direction L is at least two times the number of the nanostructure(s) having an angle exceeding 45° with respect to the longitudinal direction L, it can be determined that the at least one nanostructure 114 is aligned in the longitudinal direction L. When the at least one nanostructure 114 is aligned in the longitudinal direction L, a resistance between the first electrode 112 and the second electrode 113 may be reduced compared to the case in which the at least one nanostructure 114 is arbitrarily disposed.

At least a portion of the at least one nanostructure 114 may be disposed within the polymer substrate 111 as shown in FIG. 2. In this case, the polymer substrate 111 may act to protect the at least one nanostructure 114. For example, when a portion or all of the at least one nanostructure 114 is disposed within the polymer substrate 111, the possibility of the at least one nanostructure 114 being separated from the polymer substrate 111 may be reduced compared to a case in which the at least one nanostructure 114 is disposed outside the polymer substrate 111. For example, when a portion or all of the at least one nanostructure 114 is disposed within the polymer substrate 111, noise caused by a liquid or the like with which the at least one nanostructure 114 may come in contact may be reduced compared to the case in which the at least one nanostructure 114 is disposed outside the polymer substrate 111. Unlike as illustrated in FIG. 2, the at least one nanostructure 114 may be formed above the surface of the polymer substrate 111.

In one embodiment, the at least one nanostructure 114 may be used as an electric line for electrically connecting the first electrode 112 to the second electrode 113. For example, electrical characteristics of the at least one nanostructure 114 may be changed according to an amount or degree of light, molecules, deoxyribonucleic acid (DNA) or temperature. In this case, the at least one nanostructure 114 may be used as a component of a sensor or a transistor.

The circuit board 100 does not necessarily include a closed circuit formed in the polymer substrate 111. That is, the circuit board 100 may have the first electrode 112, the second electrode 113 and the at least one nanostructure 114 electrically connected between the first and second electrodes which are formed on the polymer substrate 111 without the closed circuit.

As described above, nanostructures are not randomly arranged but are uniformly arranged between electrodes, and thus the circuit board may have a small resistance between the electrodes. In addition, a nanostructure circuit is depressed in a polymer substrate, and thus the circuit board may be flexible and stable.

Figure 3:
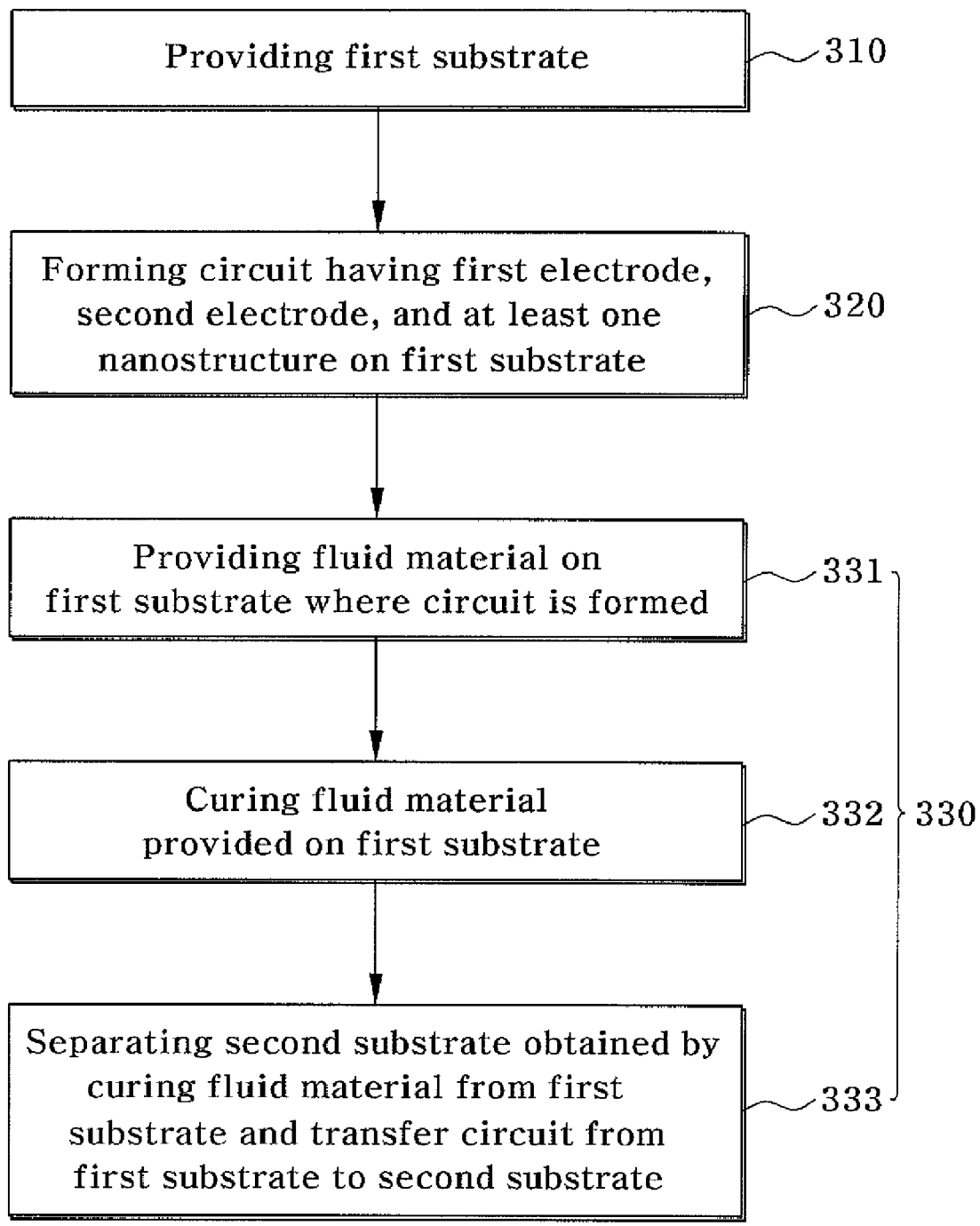
FIG. 3 is a flowchart illustrating a method for fabricating a circuit board according to one embodiment.

FIG. 3 is a flowchart illustrating a method for fabricating a circuit board according to one embodiment. Beginning in block 310, a first substrate is provided. The first substrate may be, for example, a substrate formed of a metal (e.g., gold, aluminum), a semiconductor (e.g., silicon, silicon-on-insulator), glass or an oxide (e.g., $SiO_2$).

In block 320, a circuit including a first electrode, a second electrode, and at least one nanostructure is formed on the first substrate. The at least one nanostructure, for example, may have a nanotube, a nanowire, or a nanorod, each having a linear structure. The nanotube may be a carbon nanotube. The nanowire and nanorod may be formed of various materials including a conductive polymer, vanadium oxide, indium oxide, zinc oxide, tin oxide, cadmium oxide, silicon, germanium, gallium nitride, or combinations thereof. When the circuit is formed on the first substrate, the closed circuit may not be necessarily formed, and the first electrode, the second electrode and the at least one nanostructure may be formed on the first substrate without the closed circuit.

In block 330, the circuit is then transferred from the first substrate to a surface of a second substrate formed of a polymer. The second substrate may be, for example, a flexible substrate. The flexible substrate may be a silicon polymer substrate such as, by way of example, a PDMS substrate. Block 330 may include blocks 331 to 333 as shown in FIG. 3. In block 331, a fluid material is provided on the first substrate with the circuit. In block 332, the fluid material provided on the first substrate is cured by a conventional method. In block 333, the second substrate obtained by curing the fluid material is separated from the first substrate so that the circuit is transferred from the first substrate to the second substrate.

When the circuit board is fabricated by the method as described above, the circuit may be formed in the substrate made of a semiconductor, a metal, glass, or an oxide using a conventional microfabrication process and then transferred to the polymer substrate, so that the circuit may be easily formed on the polymer substrate. In addition, when the circuit board is fabricated in the manner as described above, at least a portion of the at least one nanostructure may be disposed in the polymer substrate.

FIGS. 4 to 11 are plan views ((a) of FIGS. 4 to 11) and cross-sectional views ((b) of FIGS. 4 to 11) illustrating a method for fabricating a circuit board according to one embodiment. The cross-sectional view of each drawing is taken from a line A-A! in the plan view.

Referring to FIG. 4, a first substrate 431 is prepared. Various kinds of substrates as described above with reference to FIG. 3 may be used as the first substrate 431.

Figure 5:
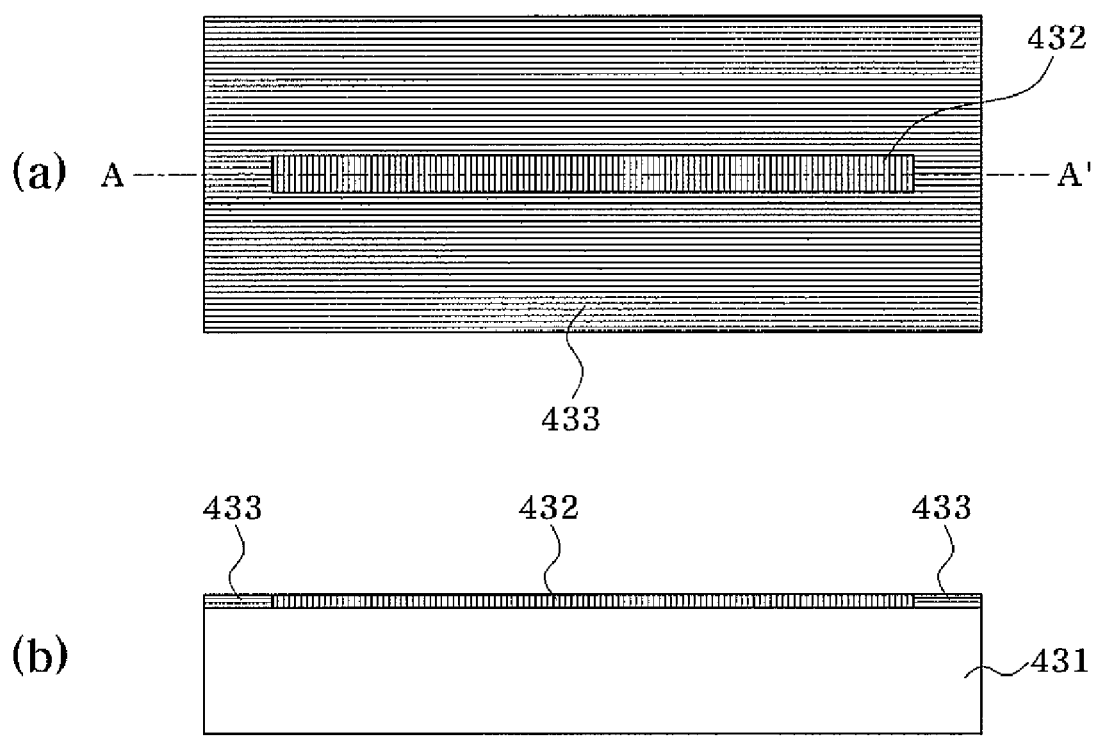

Referring to FIG. 5, a polar molecular layer pattern 432 and a nonpolar molecular layer pattern 433 are formed on the first substrate 431. The formation of the polar molecular layer pattern 432 and the nonpolar molecular layer pattern 433 allows a surface of the first substrate 431 to be divided into a region where the polar molecular layer pattern 432 is formed and a region where the nonpolar molecular layer pattern 433 is formed.

The polar molecular layer pattern 432 may be charged with positive or negative ions in accordance with the used material. When an oxide nanostructure usually having surface charges is provided onto the polar molecular layer pattern 432, the oxide nanostructure adheres to the surface of the polar molecular layer pattern 432 by electrostatic interaction between the oxide nanostructure and the polar molecular layer pattern 432. In one embodiment, when the first substrate 431 is formed of gold, the polar molecular layer pattern 432 may be, for example, a self-assembled monolayer (SAM) having a compound with a carboxyl group terminus (—COOH/—COO—). In this case, the polar molecular layer pattern 432 is charged with negative ions. The compound having the carboxyl group terminus may be, for example, 16-mercaptohexadecanoic acid (MHA). In another embodiment, when the first substrate 431 is formed of gold, the polar molecular layer pattern 432 may be, for example, an SAM having 2-mercaptoimidazole (2-MI) or a compound having an amino group terminus (—$NH_2$/—$NH_3^+$). In this case, the polar molecular layer pattern 432 is charged with positive ions. The compound having the amino group terminus may be, for example, cysteamine. In still another embodiment, when the first substrate 431 is formed of silica ($SiO_2$), the polar molecular layer pattern 432 may be, for example, an SAM having aminopropyltriethoxysilane (APTES).

The nonpolar molecular layer pattern 433 is not charged with positive or negative ions but neutral. Accordingly, when the oxide nanostructure is used as the nanostructure, the nanostructure may not be attached to the nonpolar molecular layer pattern 433. Even when the nanostructure is attached to the nonpolar molecular layer, the nanostructure may be relatively easily detached from the nonpolar molecular layer compared to the nanostructures attached to the polar molecular layer pattern 432. The nonpolar molecular layer pattern 432 may be, for example, an SAM having a compound with a methyl terminus. In one embodiment, when the first substrate 431 is formed of gold, the suitable material for forming the nonpolar molecular layer pattern 433 may be a thiol compound such as 1-octadecanethiol (ODT). In another embodiment, when the first substrate 431 is formed of silica, silicon, or aluminum, the suitable material for forming the nonpolar molecular layer pattern 433 may be, for example, a silane compound such as octadecyltrichlorosilane (OTS), octadecyltrimethoxysilane (OTMS) or octadecyltriethoxysilane (OTE).

The polar molecular layer pattern 432 and the nonpolar molecular layer pattern 433 may be formed by, for example, a dip-pen nanolithography (DPN) method, a microcontact printing method (μCP) or a photolithography method.

Figure 6:
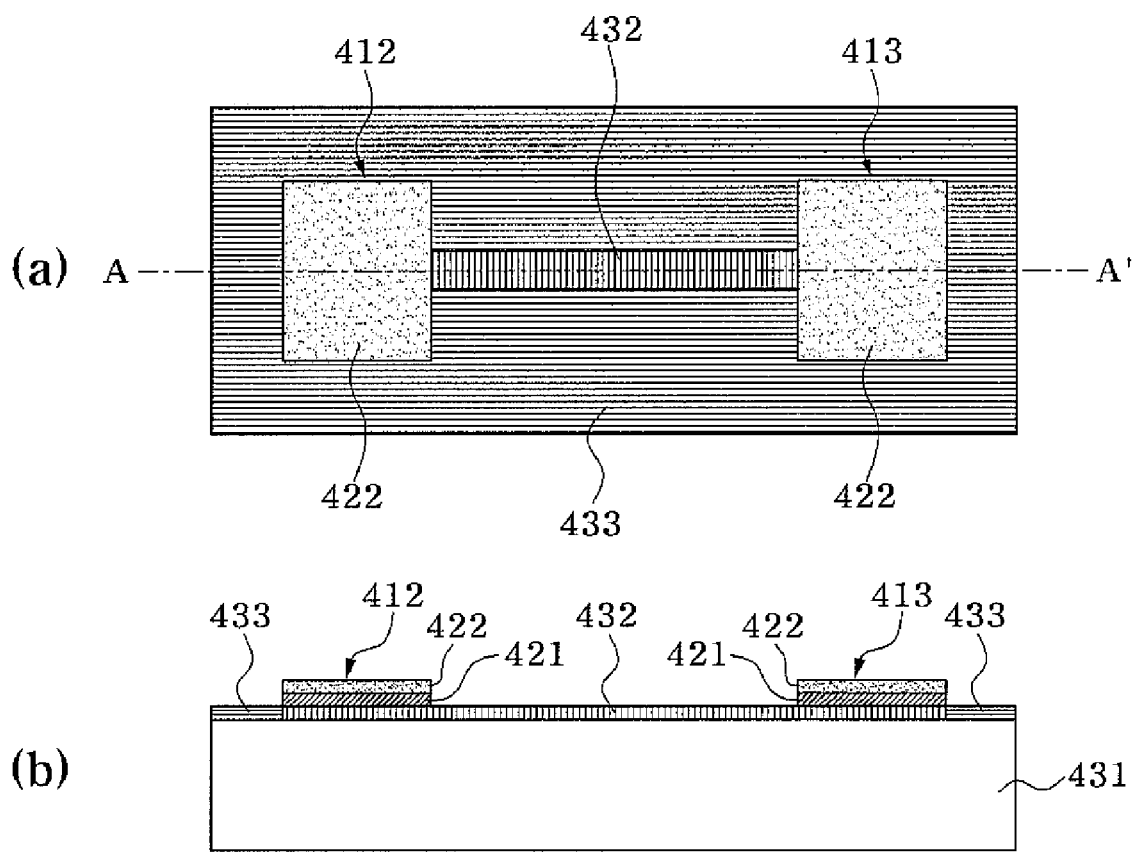

Referring to FIG. 6, the first electrode 412 and the second electrode 413 are formed on the polar molecular layer pattern 432. The first electrode 412 and the second electrode 413 are conductors, and may be a metal such as aluminum (Al), palladium (Pd), titanium (Ti), or gold (Au) or doped polysilicon. Each of the first electrode 412 and the second electrode 413 may have a single-layer structure or a multilayer structure (e.g., Au/Pd or Au/Ti). As illustrated in FIG. 6, each of the first electrode 412 and the second electrode 413 may include a gold layer 421 and a palladium layer 422. Patterning of the first electrode 412 and the second electrode 413 may be carried out by, for example, a photolithography process or a lift-off process.

Figure 7:
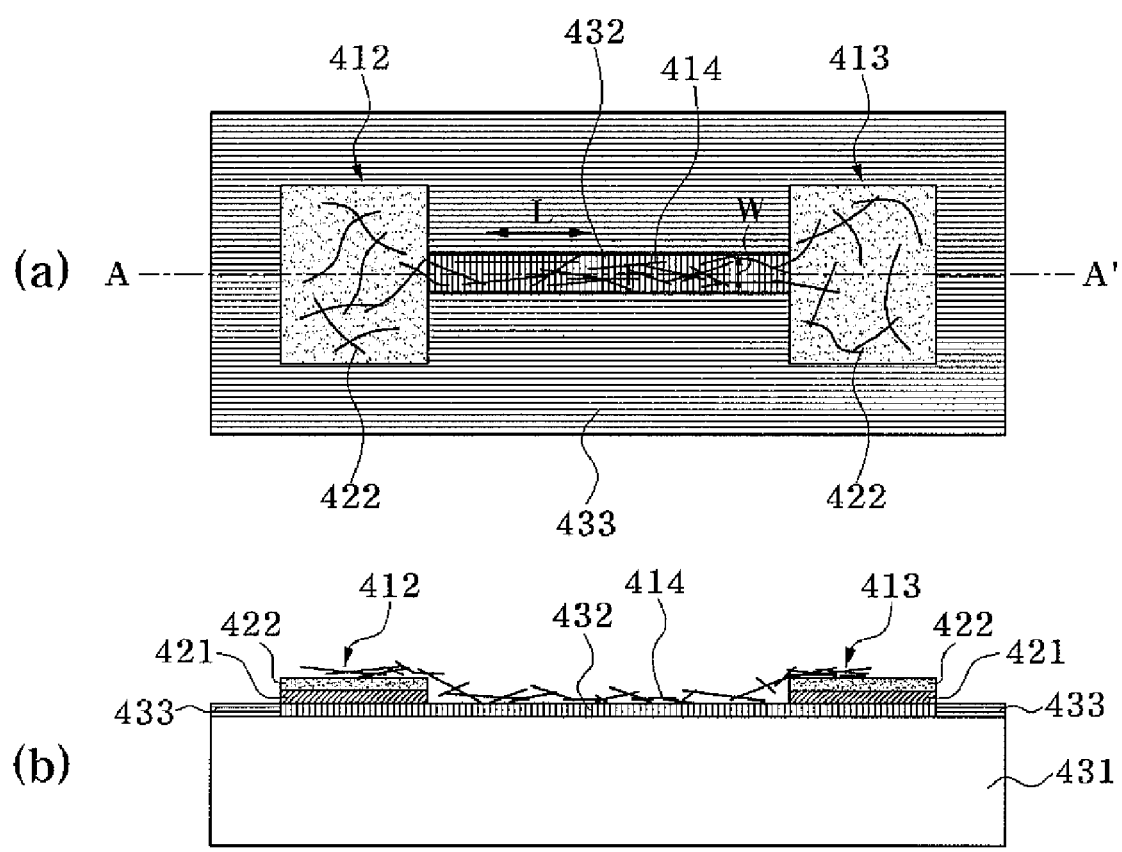
Figure 8:
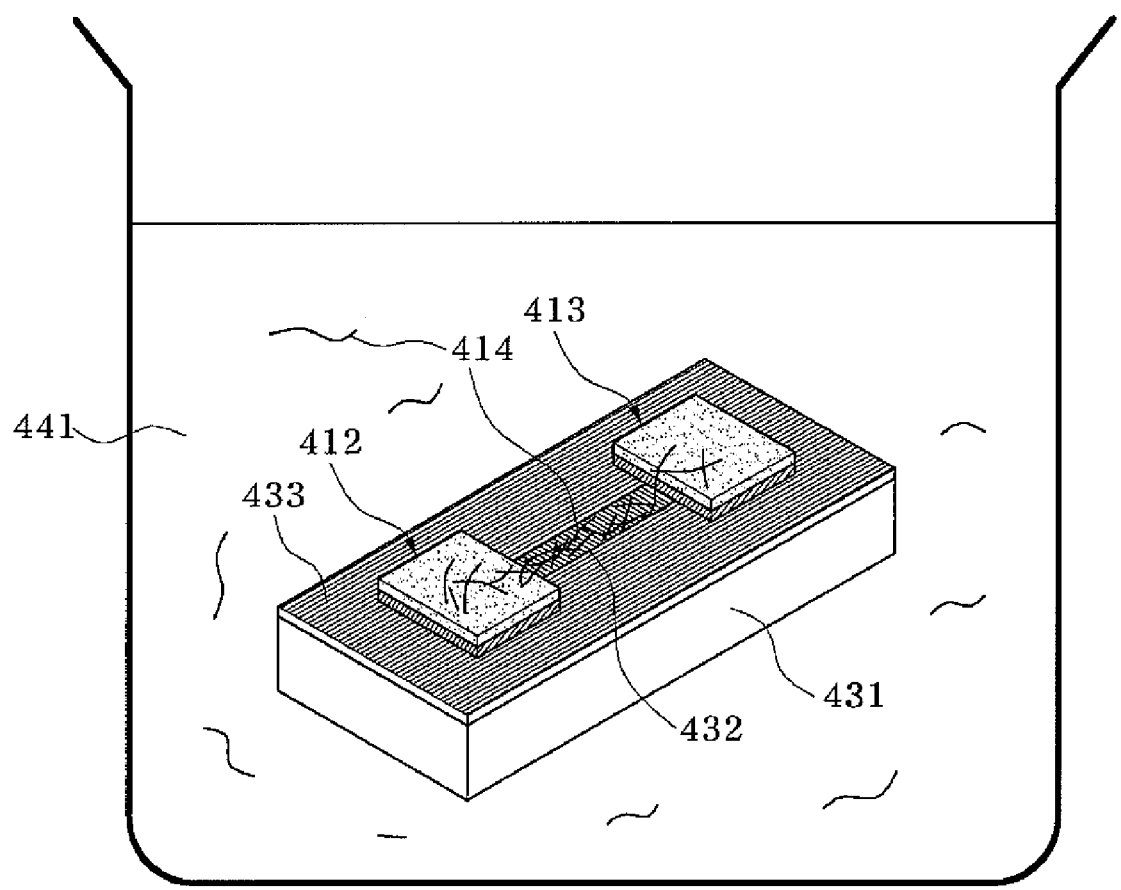

Referring to FIG. 7, the at least one nanostructure 414 is self-assembled with the polar molecular layer pattern 432. In one embodiment, as illustrated in FIG. 8, the at least one nanostructure 414 may be self-assembled with the polar molecular layer pattern 432 by immersing the first substrate 431 into a solution 441 including nanostructures.

Figure 9:
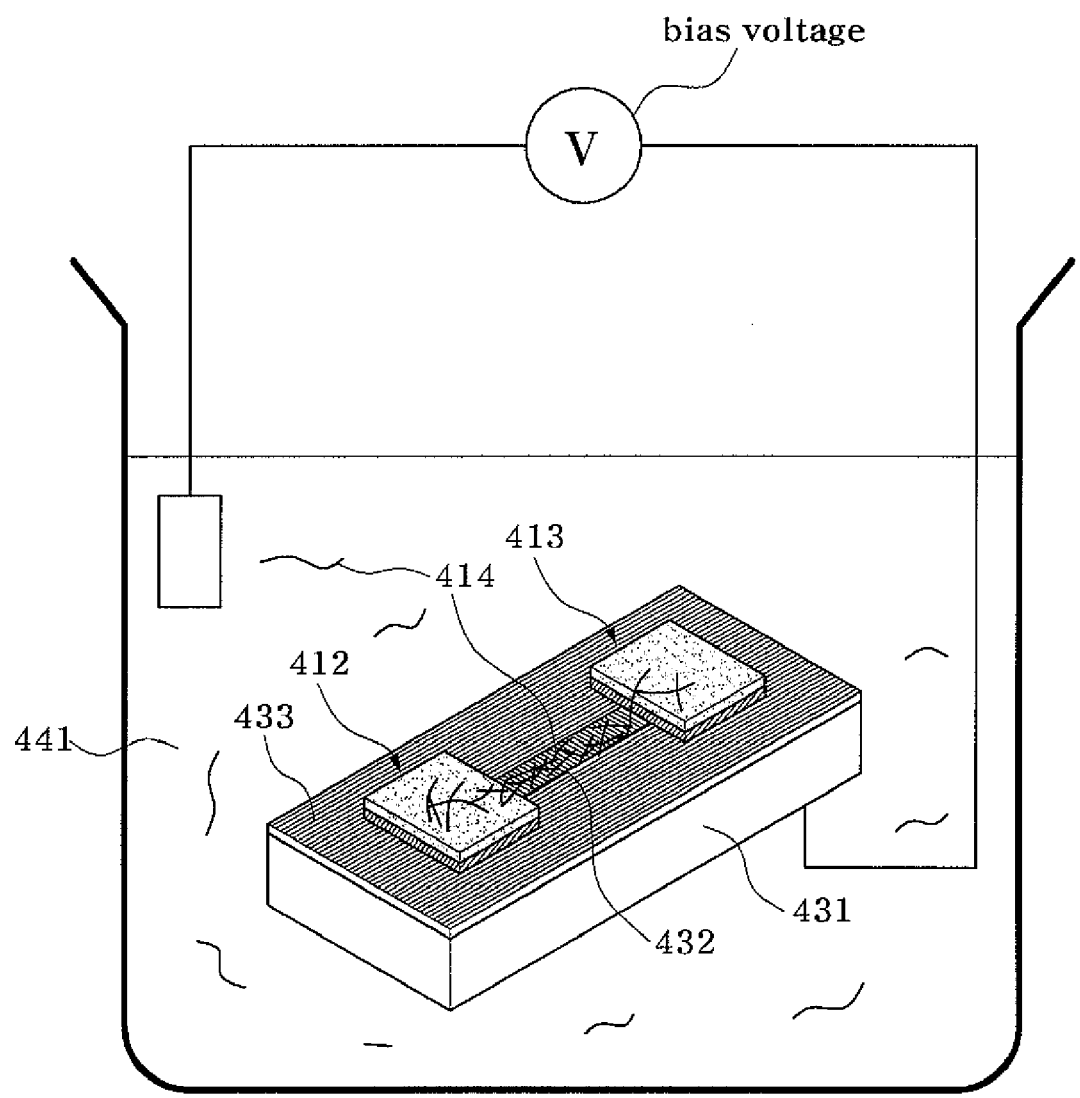

In another embodiment, as illustrated in FIG. 9, the at least one nanostructure 414 may be self-assembled with the polar molecular layer pattern 432 by immersing the first substrate 431 into the solution 441 including the nanostructures and applying a bias voltage between the first substrate 431 and the solution 441. Such an immersion is illustrated in FIG. 9. When the bias voltage is applied between the first substrate 431 and the solution 441, the at least one nanostructure 414 may be self-assembled with the polar molecular layer pattern 432 at an improved speed. For example, when a negative (−) bias is applied to the first substrate 431 where the polar molecular layer pattern 432 charged with negative ions is formed, the at least one nanostructure 414 charged with positive ions may be self-assembled with the polar molecular layer pattern 432 at a higher speed. In addition, when a positive (+) bias is applied to the first substrate 431 where the polar molecular layer pattern 432 charged with positive ions is formed, the at least one nanostructure 414 charged with negative ions may be self-assembled with the polar molecular layer pattern 432 at a higher speed.

The solution 441 including nanostructures, for example, carbon nanotubes, may be formed by putting the carbon nanotubes into 1,2-dichlorobenzene and applying an ultrasonic wave thereto. In addition, a solution including nanowires may be formed by putting the nanowires into deionized water and applying an ultrasonic wave thereto.

The surfaces of the nanostructures may be oxidized in the air and the nanostructures having an oxide on their surfaces may be charged with positive or negative ions. Accordingly, when the first substrate 431 is immersed into the solution including the charged nanostructures as described above, the nanostructures may be adsorbed onto the polar molecular layer pattern 432 caused by electrostatic interaction between the polar molecular layer pattern 432 and the nanostructures.

The electrostatic interaction between the nanostructures and the polar molecular layer pattern 432 may be a charge-charge interaction or a van der Waals force such as a dipole-driven force.

In one embodiment, zinc oxide (ZnO) exhibits a positive charge due to the presence of an oxygen vacancy, so that the nanostructures formed of the zinc oxide are strongly adsorbed onto the surface of the polar molecular layer pattern 432 charged with negative ions. In another embodiment, vanadium oxide ($V_2O_5$) exhibits a negative charge so that it is adsorbed onto the surface of the polar molecular layer pattern 432 charged with positive ions. In still another embodiment, the carbon nanotube is adsorbed onto not only the surface of the polar molecular layer pattern 432 charged with positive ions but also the surface of the polar molecular layer pattern 432 charged with negative ions.

When the at least one nanostructure 414 is self-assembled with the polar molecular layer pattern 432, the at least one nanostructure 414 may be aligned in the longitudinal direction L of the polar molecular layer pattern 432. For example, when the number of nanostructure(s) having an angle of 45° or less with respect to the longitudinal direction L is at least two times the number of the nanostructure(s) having an angle exceeding 45° with respect to the longitudinal direction L, it can be determined that the at least one nanostructure 414 is aligned in the longitudinal direction L. The degree of the alignment of the at least one nanostructure 414 in the longitudinal direction L may be increased with a smaller width W of the polar molecular layer pattern 432. For example, the width W of the polar molecular layer pattern 432 may be less than ½ of the average length of the at least one nanostructure 414.

Referring to FIGS. 6 and 7, the at least one nanostructure 414 is attached to the polar molecular layer pattern 432 after the first electrode 412 and the second electrode 413 are formed. Alternatively, the at least one nanostructure 414 may be attached to the polar molecular layer pattern 432 before the first electrode 412 and the second electrode 413 are formed.

Figure 10:
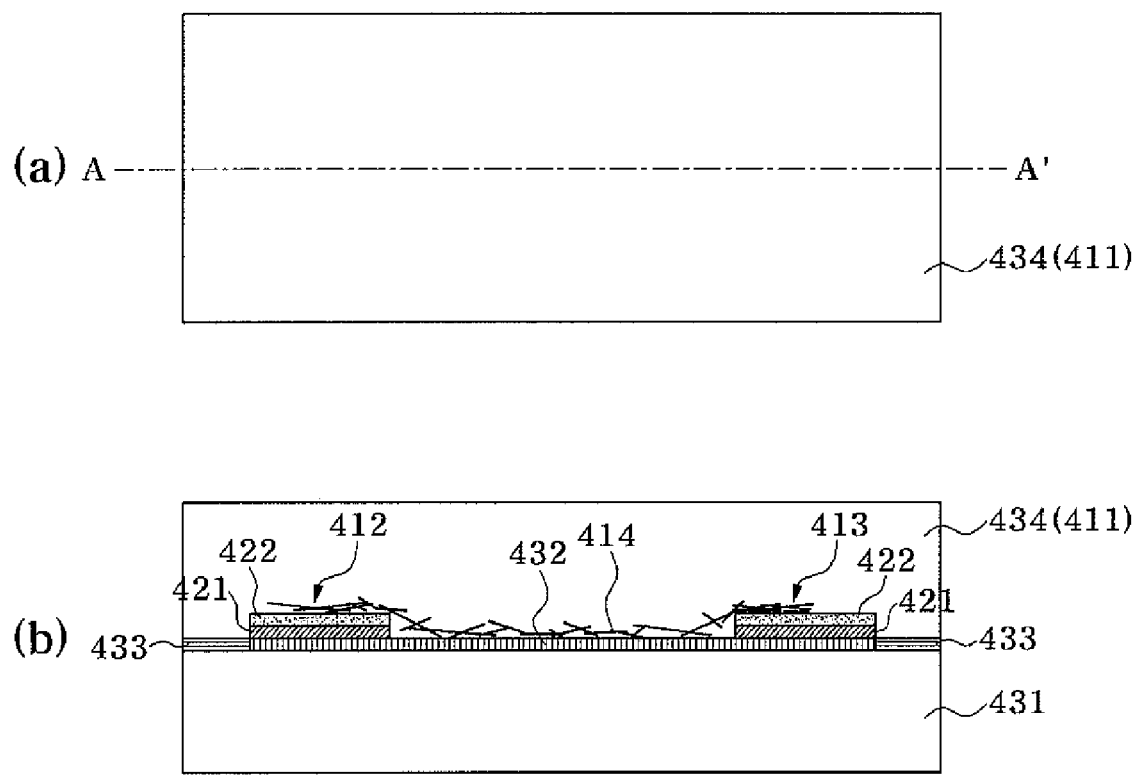

Referring to FIG. 10, a fluid material 434 is provided on the first substrate 431 and then cured. The second substrate 411 is formed of a polymer by curing the fluid material 434. The fluid material 434 may be, for example, a pre-polymer such as PDMS. PDMS may be, for example, cured by heating or ultraviolet (UV) irradiation.

Figure 11:
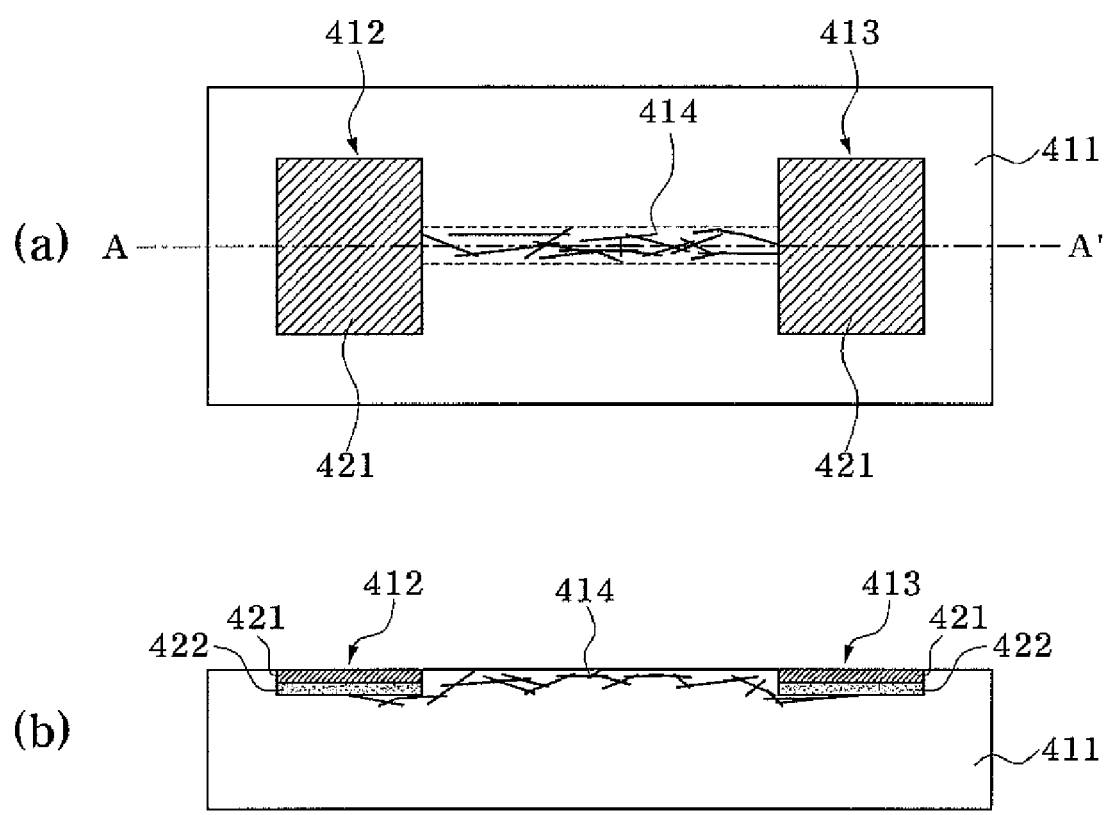

Referring to FIG. 11, the second substrate 411 obtained by curing the fluid material 434 is separated from the first substrate 431 so that the first electrode 412, the second electrode 413 and the at least one nanostructure 414 are transferred from the first substrate 431 to the second substrate 411.

FIGS. 12 to 17 are plan views ((a) of FIGS. 12 to 17) and cross-sectional views ((b) of FIGS. 12 to 17) illustrating a method for fabricating a circuit board according to another embodiment. The cross-sectional view of each drawing is taken from a line A-A' in the plan view.

Referring to FIG. 12, a first substrate 1231 is prepared.

Figure 13:
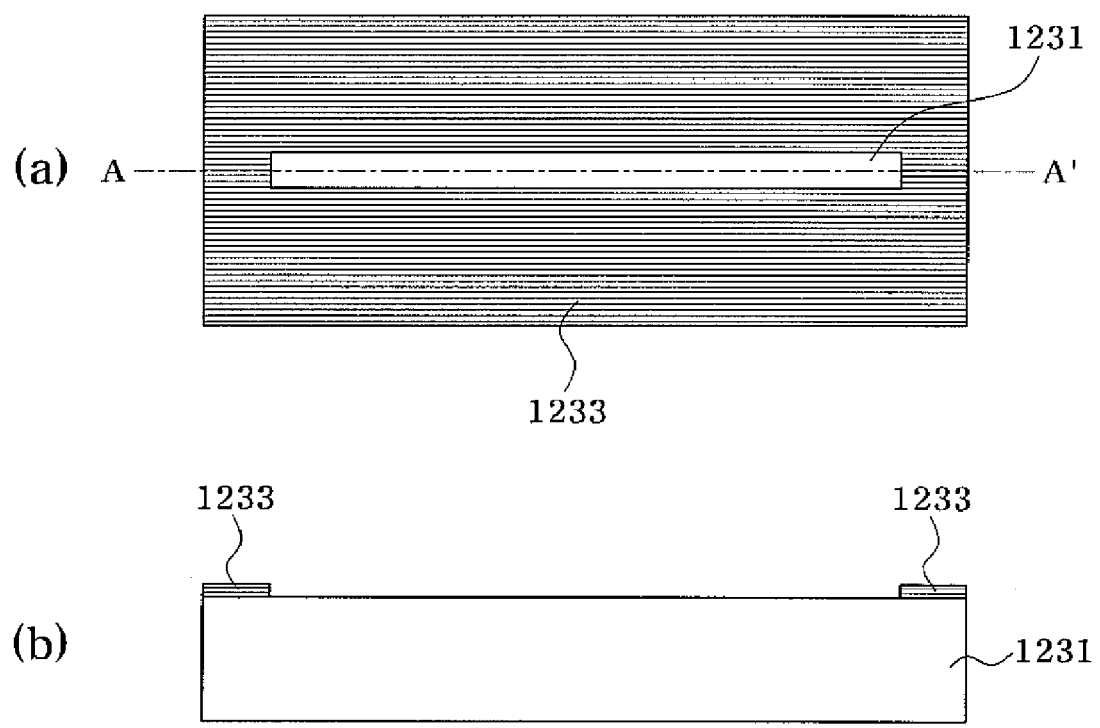

Referring to FIG. 13, a nonpolar molecular layer pattern 1233 is formed on the first substrate 1231. Various materials as described in the previously disclosed embodiment may be used as suitable materials for forming the nonpolar molecular layer pattern 1233. The nonpolar molecular layer pattern 1233 is formed to expose a certain region of a surface of the first substrate 1231 as shown in FIG. 13.

Figure 14:
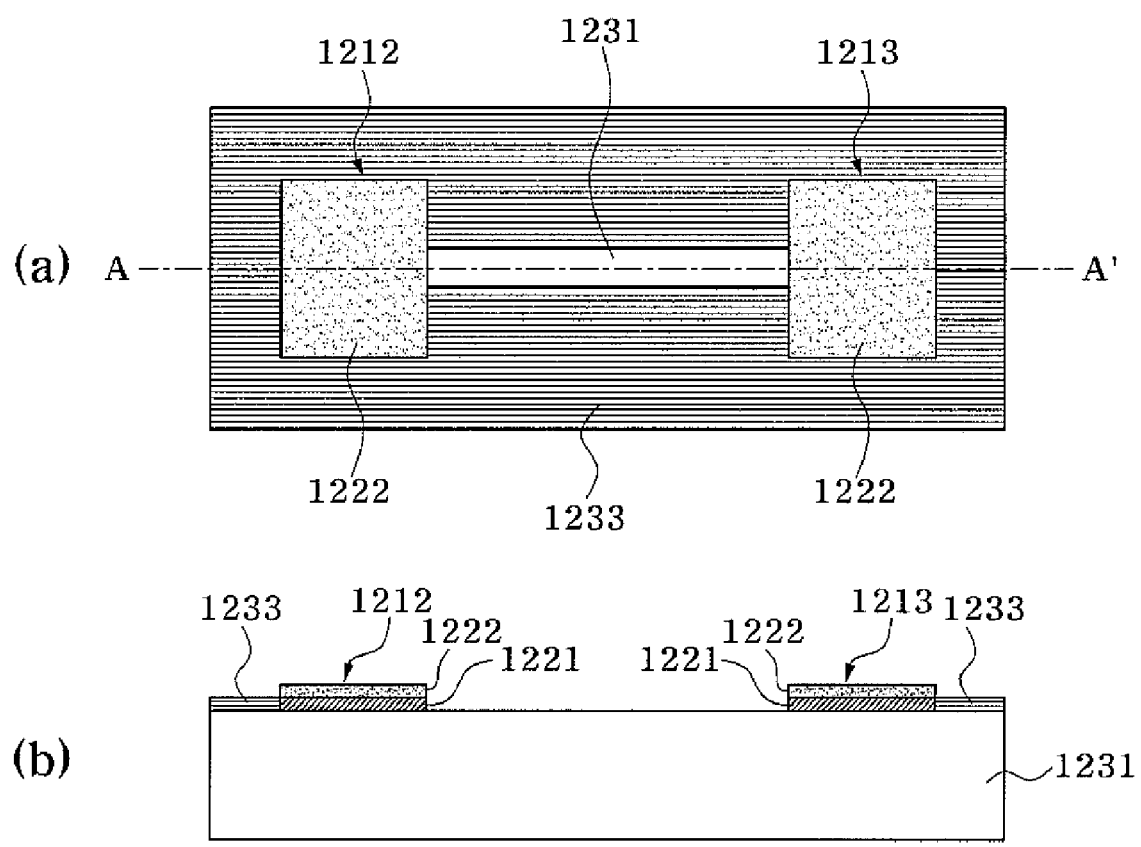

Referring to FIG. 14, a first electrode 1212 and a second electrode 1213 are formed on the first substrate 1231. Various materials as described in the previously-described embodiment may be used as suitable materials for forming the first electrode 1212 and the second electrode 1213. Each of the first electrode 1212 and the second electrode 1213 may include a multilayer structure having a gold (Au) layer 1221 and a palladium (Pd) layer 1222 as shown in FIG. 14.

Figure 15:
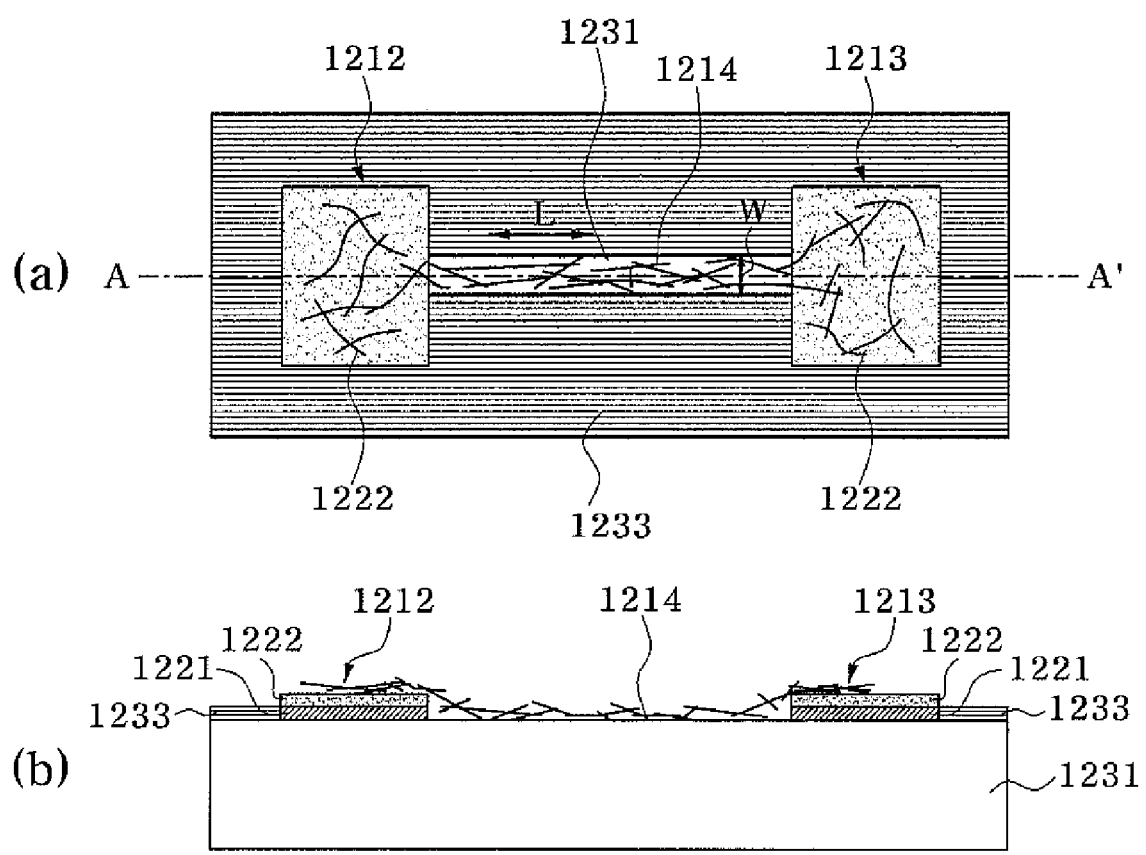

Referring to FIG. 15, the at least one nanostructure 1214 is self-assembled with the exposed region of the first substrate 1231. In one embodiment, the at least one nanostructure 1214 may be self-assembled with the exposed region by immersing the first substrate 1231 into a solution including the nanostructures. In another embodiment, the at least one nanostructure 1214 may be self-assembled with the exposed region by immersing the first substrate 1231 into the solution 1241 including the nanostructures and applying a bias voltage between the first substrate 1231 and the solution 1241. Such an immersion is substantially identical to those illustrated in FIGS. 8 and 9, so that a detailed description thereof is omitted for simplicity of description. When the at least one nanostructure 1214 is self-assembled with the exposed region, the at least one nanostructure 1214 may be aligned in the longitudinal direction L of the exposed region. The degree of the alignment of the at least one nanostructure 1214 may be increased with a smaller width W of the exposed region. For example, the width W of the exposed region may be less than ½ of the average length of the at least one nanostructure 1214.

Referring to FIGS. 14 and 15, the at least one nanostructure 1214 is attached to the exposed region of the first substrate 1231 after the first electrode 1212 and the second electrode 1213 are formed. Alternatively, the at least one nanostructure 1214 may be attached to the exposed region of the first substrate 1231 before the first electrode 1212 and the second electrode 1213 are formed.

Figure 16:
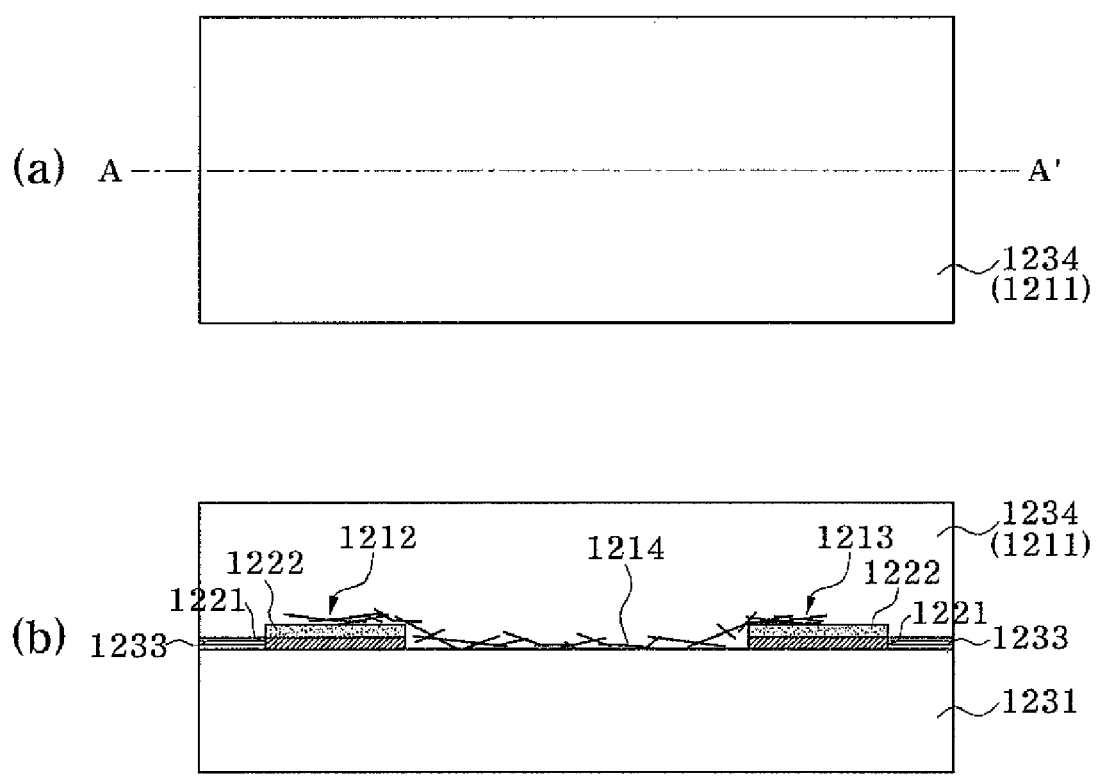

Referring to FIG. 16, a fluid material 1234 is provided on the first substrate 1231 and then cured. The second substrate 1211 is formed of a polymer by curing the fluid material 1234.

Figure 17:
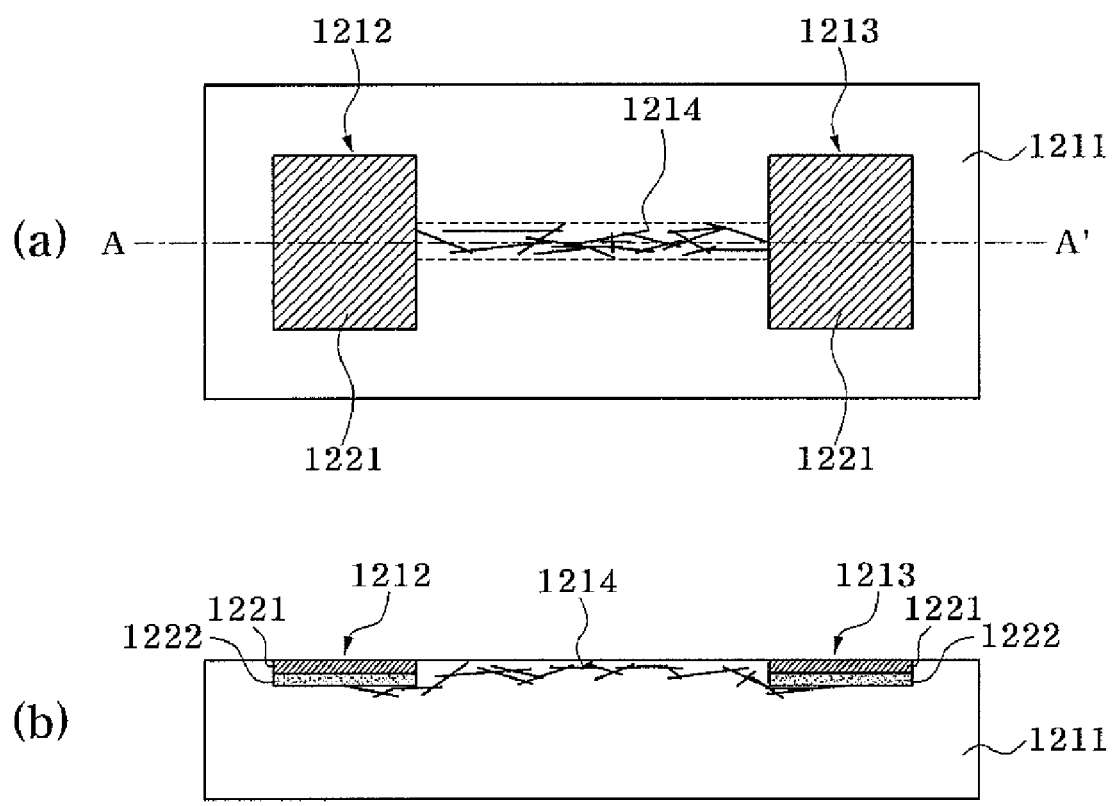

Referring to FIG. 17, the second substrate 1211 obtained by curing the fluid material 1234 is separated from the first substrate 1231, so that the first electrode 1212, the second electrode 1213 and the at least one nanostructure 1214 are transferred from the first substrate 1231 to the second substrate 1211.

As described above, the at least one nanostructure 1214 may be attached onto the bare surface of the first substrate 1231 exposed between the nonpolar molecular layers 1233. The bare surface of the first substrate 1231 is naturally polarized, so that it can act similarly to the polar molecular layer pattern 432 described with reference to FIGS. 4 to 11. That is, the at least one nanostructure 1214 may not be attached to the nonpolar molecular layer pattern 1233 but attached to the exposed region of the first substrate 1231, so that it can be aligned in the longitudinal direction of the exposed region.

FIGS. 18 to 25 are plan views ((a) of FIGS. 18 to 25) and cross-sectional views ((b) of FIGS. 18 to 25) illustrating a method for fabricating a circuit board according to another embodiment. The cross-sectional view of each drawing is taken from a line A-A' in the plan view.

Referring to FIG. 18, a first substrate 1831 is prepared.

Figure 19:
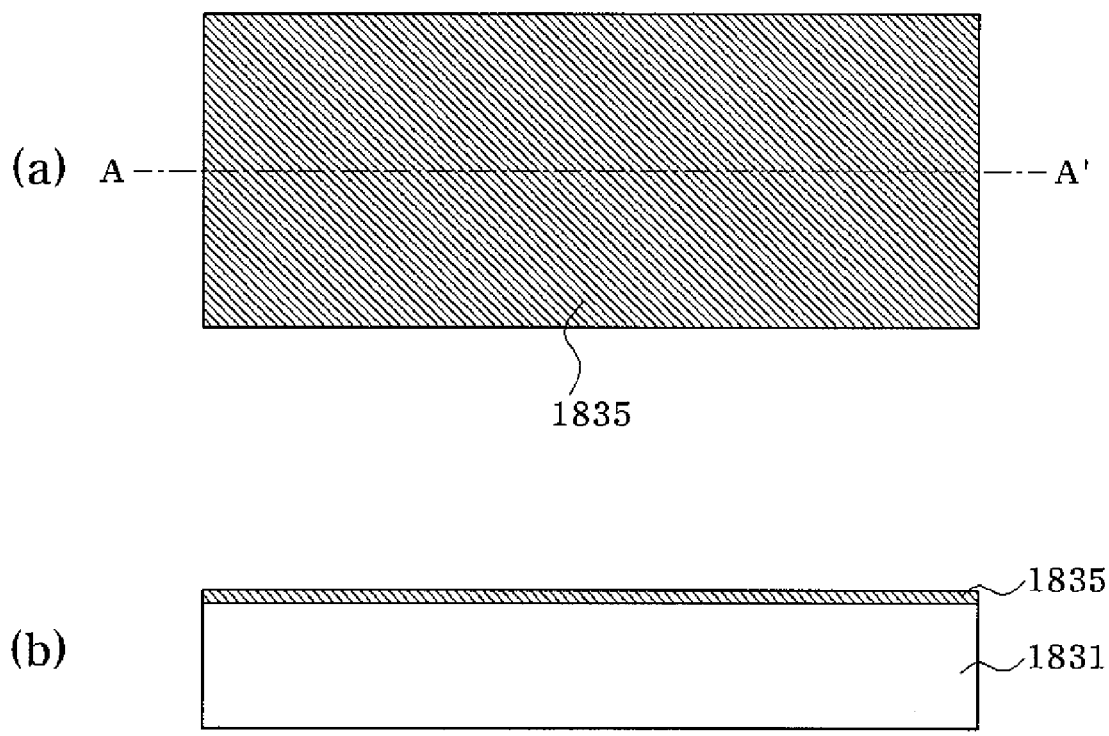

Referring to FIG. 19, a release layer 1835 is formed on the first substrate 1831. The release layer 1835 acts to allow at least one nanostructure 1814 to be formed on the first substrate 1831 in a subsequent process to be more easily transferred to a second substrate 1811. A suitable material for forming the release layer 1835 may be a nonpolar material including a methyl group at its terminus. In some embodiments, the release layer 1835 may be omitted.

Figure 20:
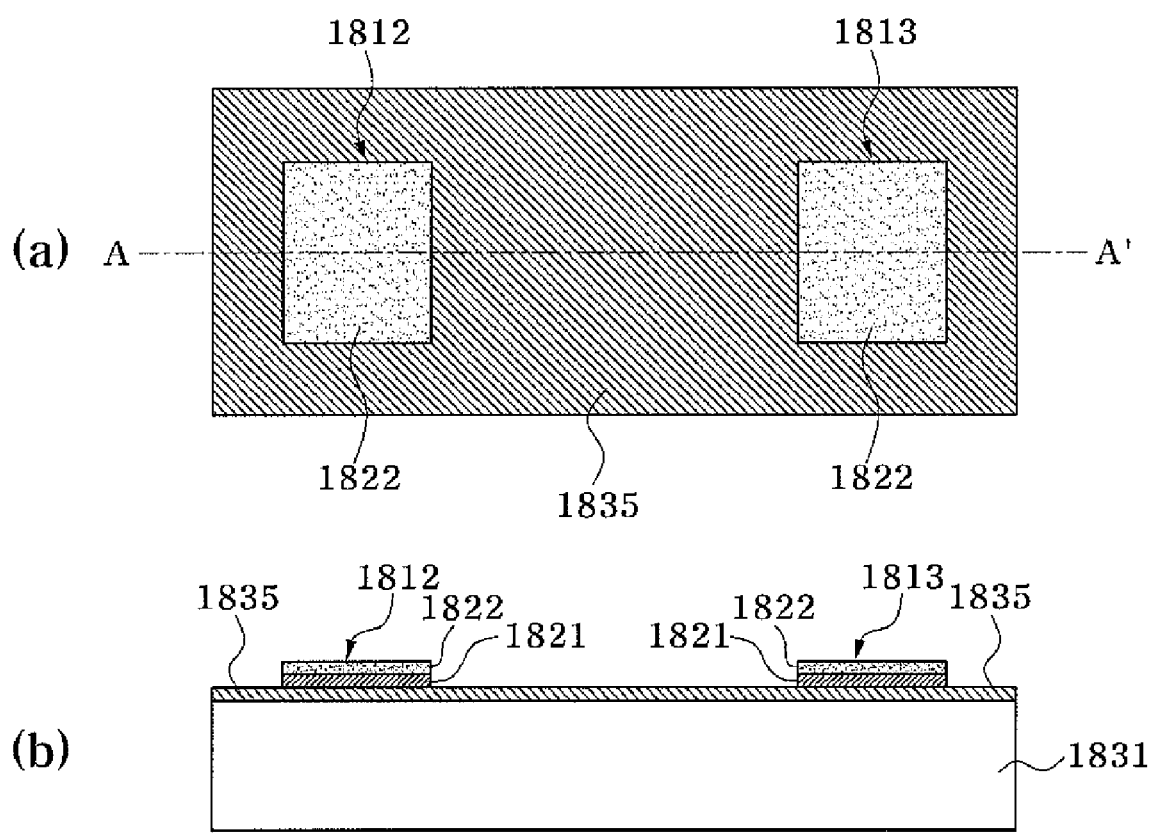

Referring to FIG. 20, a first electrode 1812 and a second electrode 1813 are formed on the release layer 1835. Various materials as described in the previously described embodiment may be used as suitable materials for forming the first electrode 1812 and the second electrode 1813. Each of the first electrode 1812 and the second electrode 1813 may have a multilayer structure including a gold layer 1821 and a palladium layer 1822 as shown in FIG. 20.

Figure 21:
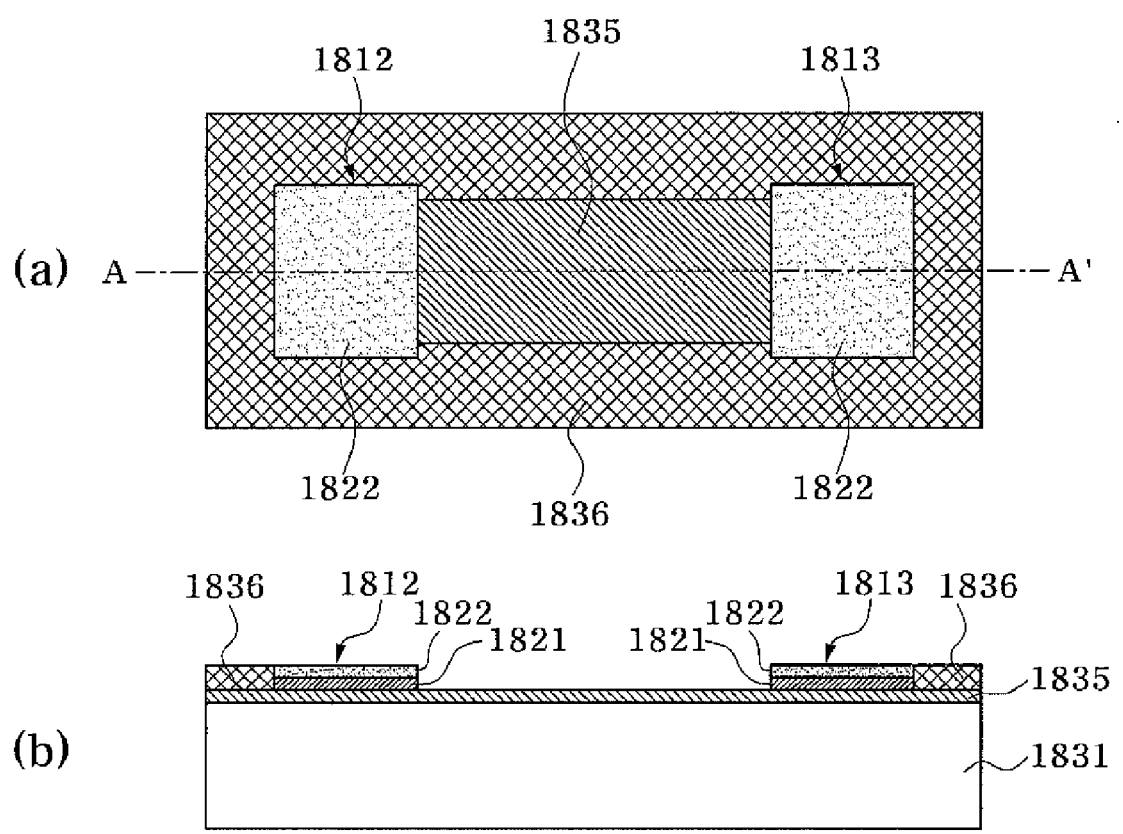

Referring to FIG. 21, a sacrificial layer pattern 1836 is formed on the first substrate 1831. The sacrificial layer pattern 1836 is formed to expose a certain region of the release layer 1835, the first electrode 1812 and the second electrode 1813. The suitable material for forming the sacrificial layer pattern 1836 may be, for example, a photoresist.

Figure 22:
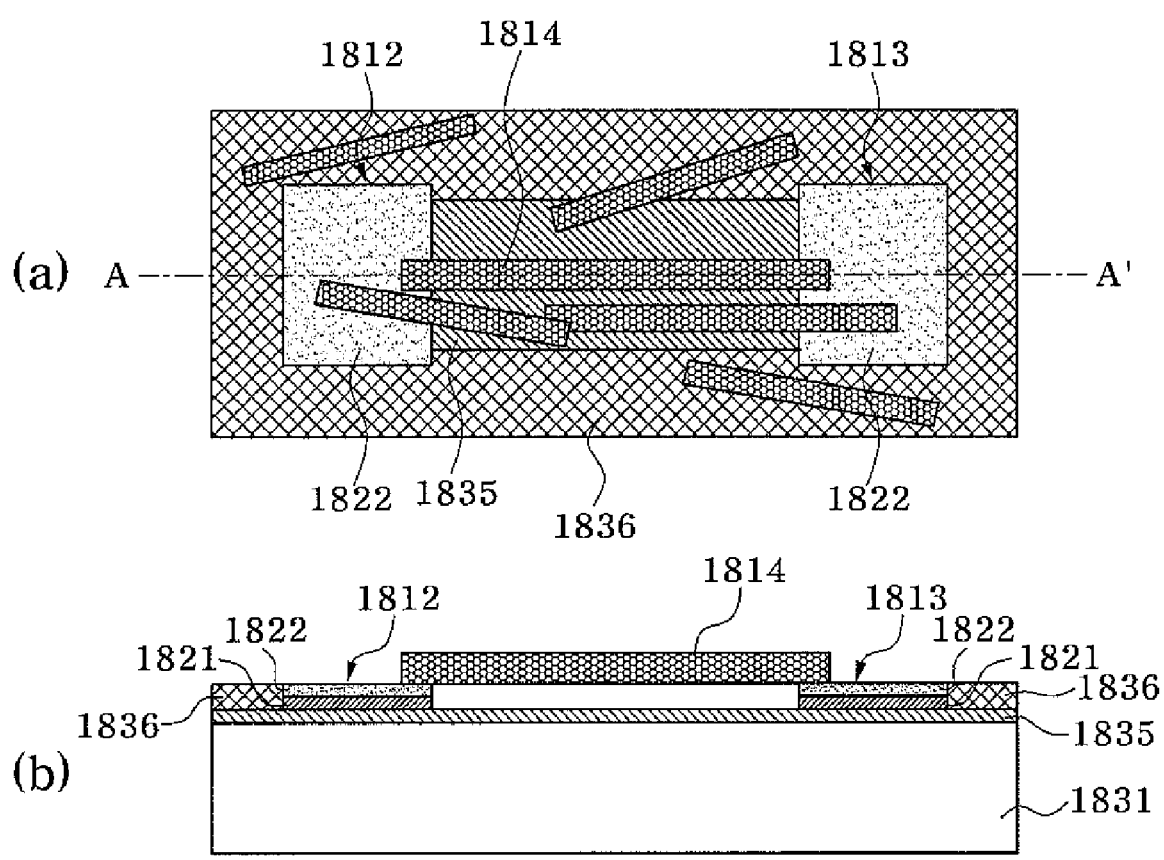

Referring to FIG. 22, the first substrate 1831 is immersed into a solution including the nanostructures to attach the at least one nanostructure 1814 onto the first substrate 1831.

Figure 23:
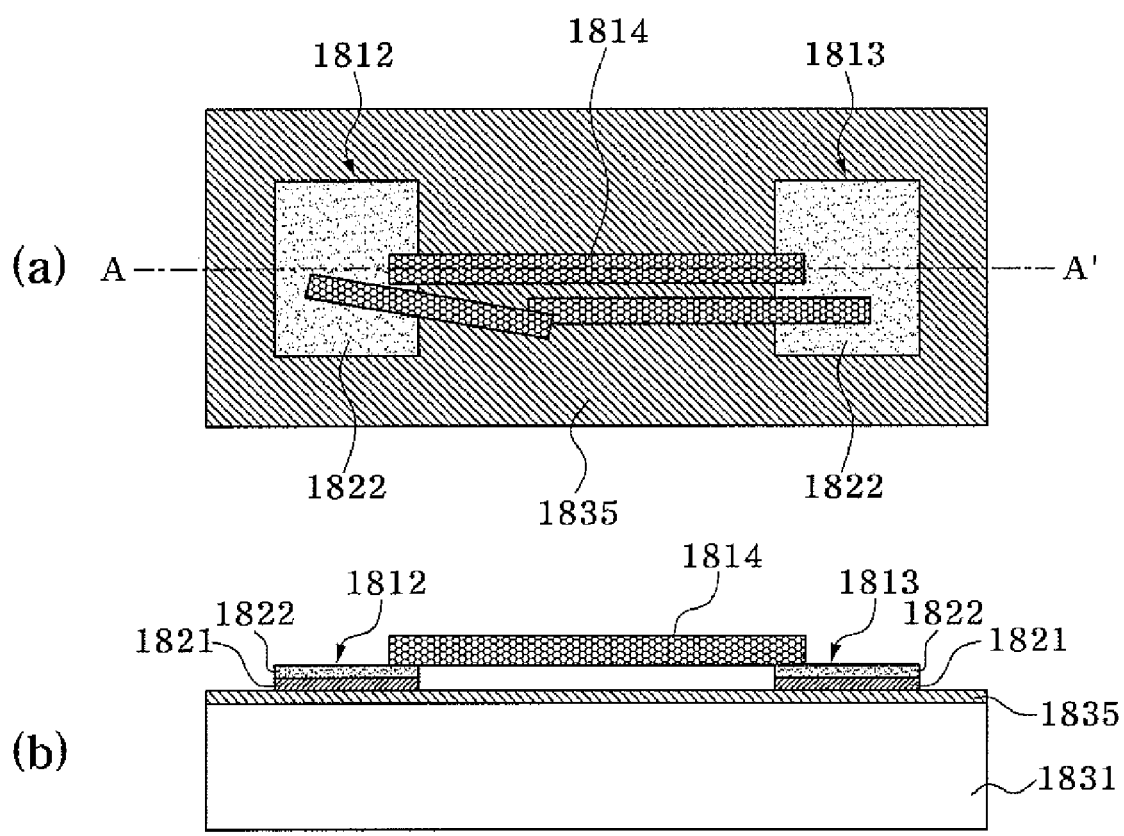

Referring to FIG. 23, by removing the sacrificial layer pattern 1836, the nanostructures attached onto the sacrificial layer pattern 1836 are removed. In addition, the nanostructures may not be attached to the release layer 1835, so that the nanostructures on the release layer 1835 may be also removed while the sacrificial layer pattern 1836 is removed. Accordingly, the nanostructures may be electrostatically connected to the first electrode 1812 and the second electrode 1813, so that only the at least one nanostructure 1814 attached to the first electrode 1812 or the second electrode 1813 is not removed. When a photoresist pattern is used as the sacrificial layer pattern 1836, a solvent such as, for example, acetone may be used to remove the sacrificial layer pattern 1836.

Figure 24:
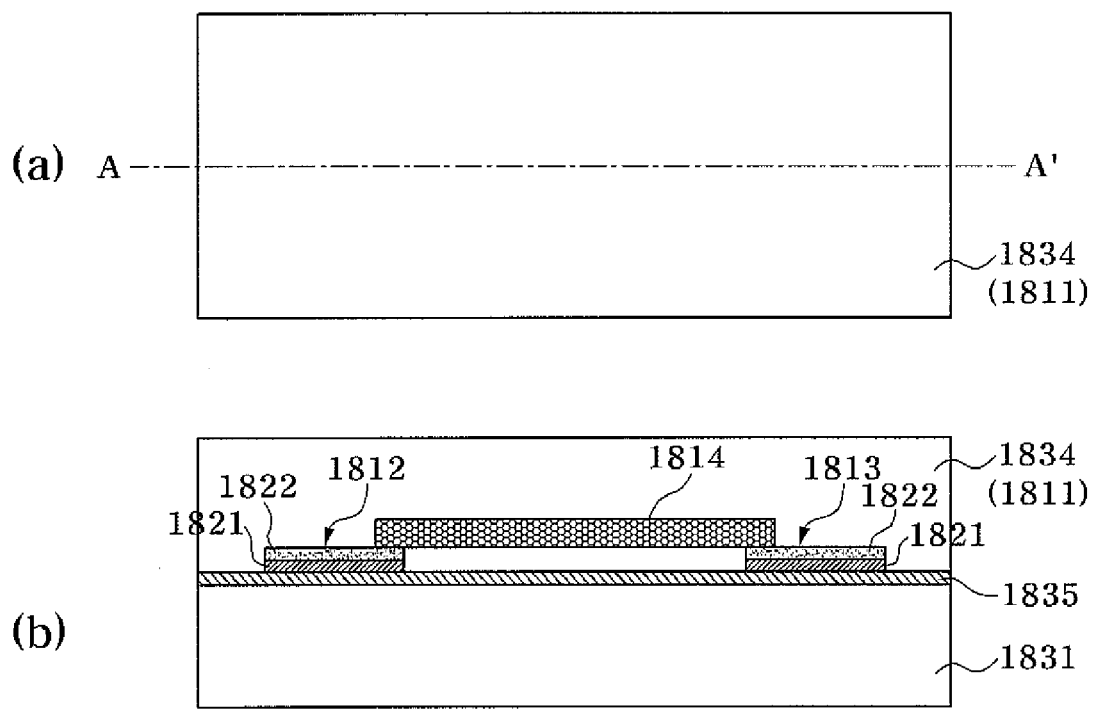

Referring to FIG. 24, a fluid material 1834 is provided on the first substrate 1831 and then cured. The second substrate 1811 is formed of a polymer by the curing the fluid material 1834.

Figure 25:
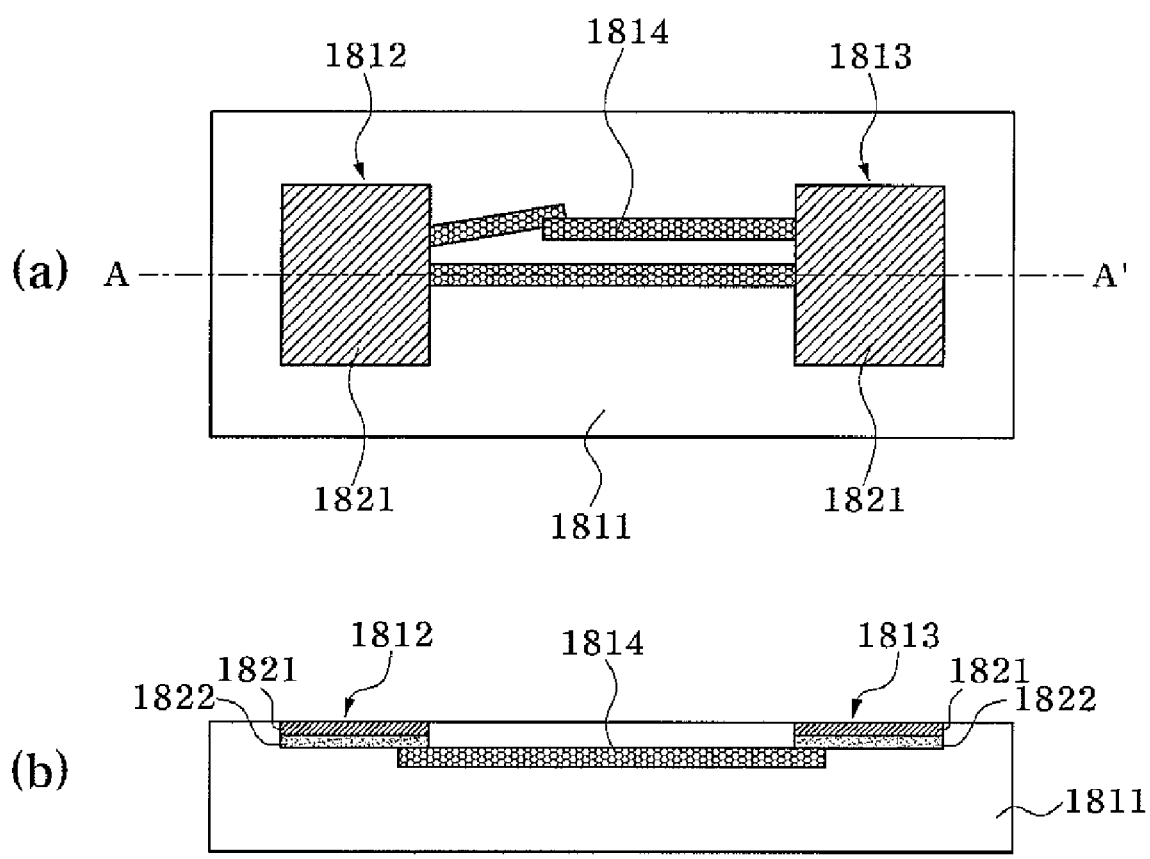
Figure 10:
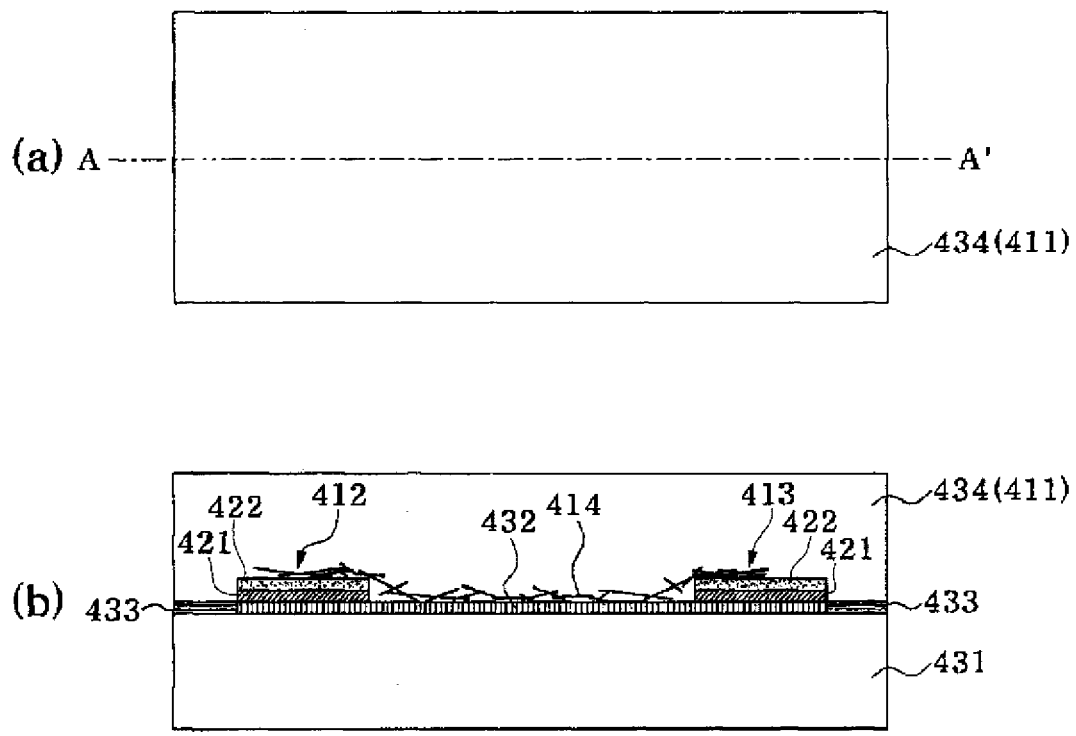
Figure 24:
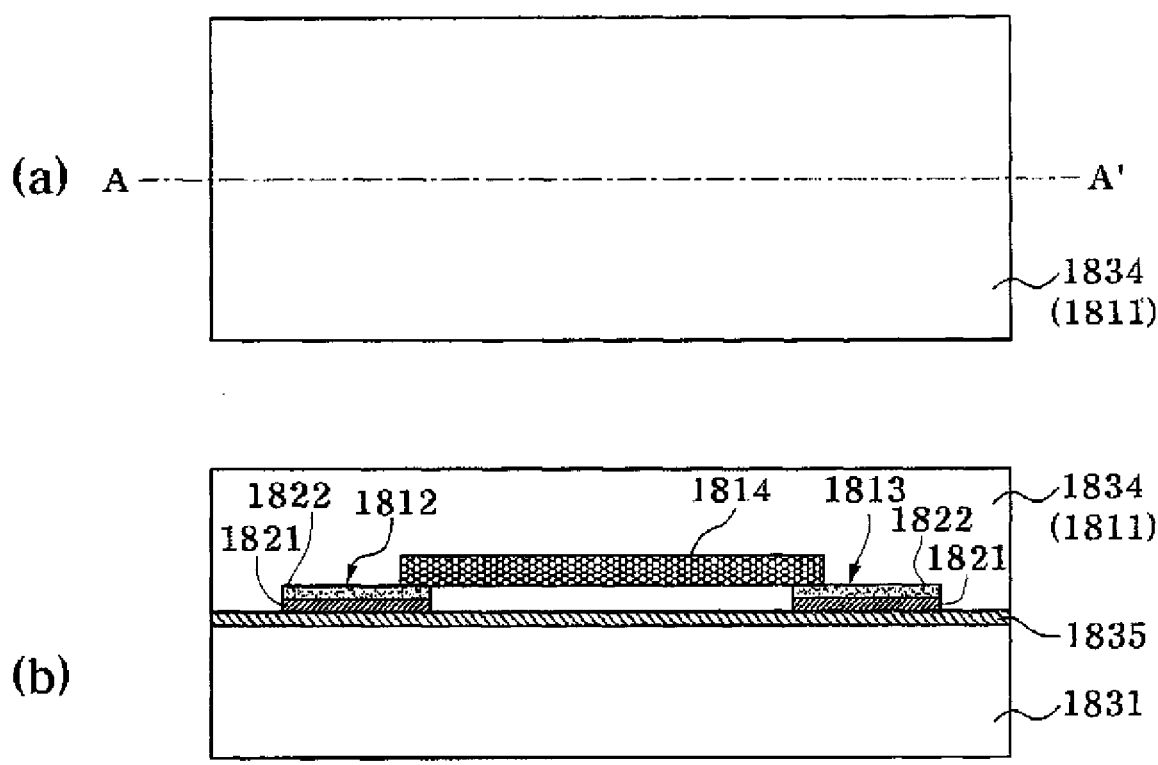

Referring to FIG. 25, the second substrate 1811 obtained by curing the fluid material 1834 is separated from the first substrate 1831, so that the first electrode 1812, the second electrode 1813 and the at least one nanostructure 1814 are transferred from the first substrate 1831 to the second substrate 1811.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

FIG. 16
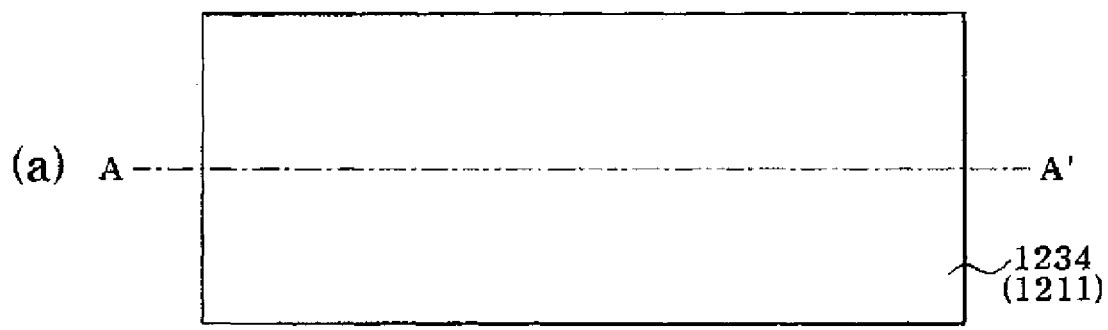
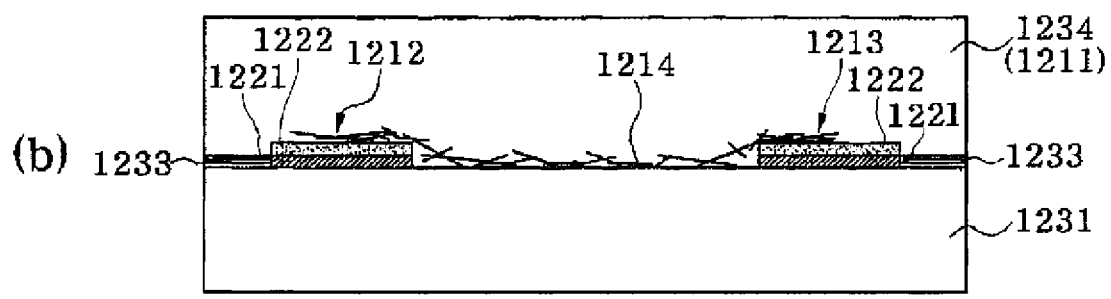

What is claimed is:

1. A method for fabricating a circuit board, comprising:
   providing a first substrate;
   forming a circuit on the first substrate, the circuit including a first electrode, a second electrode and at least one nanostructure; and
   transferring the circuit from the first substrate to a surface of a second substrate made of a polymer, wherein transferring the circuit comprises:
   providing a fluid material on the first substrate with the circuit;
   curing the fluid material provided on the first substrate; and
   separating the second substrate obtained by curing the fluid material from the first substrate and transferring the circuit from the first substrate to the second substrate.

2. The method of claim 1, wherein the second substrate is a flexible substrate.

3. The method of claim 1, wherein the second substrate is a silicon polymer substrate.

4. The method of claim 1, wherein the second substrate is a polydimethylsiloxane (PDMS) substrate.

5. The method of claim 1, wherein the first substrate is a substrate made of a semiconductor, a metal, glass or an oxide.

6. A method for fabricating a circuit board, comprising:
   providing a first substrate;
   forming a circuit on the first substrate, the circuit including a first electrode, a second electrode and at least one nanostructure; and
   transferring the circuit from the first substrate to a surface of a second substrate made of a polymer, wherein forming the circuit on the first substrate comprises:
   forming a polar molecular layer pattern and a nonpolar molecular layer pattern on the first substrate; and
   self-assembling the at least one nanostructure with the polar molecular layer pattern.

7. The method of claim 6, wherein forming the circuit on the first substrate further comprises forming the first and the second electrodes on the polar molecular layer pattern.

8. The method of claim 6, wherein the first substrate is immersed into a solution including nanostructures to self-assemble the at least one nanostructure with the polar molecular layer pattern during forming the circuit on the first substrate.

9. The method of claim 8, wherein a bias voltage is applied between the solution and the first substrate during forming the circuit on the first substrate.

10. The method of claim 6, wherein the nonpolar molecular layer pattern is a monolayer including a compound with a methyl terminus.

11. The method of claim 6, wherein the polar molecular layer pattern is a monolayer pattern including a compound with an amino group terminus or a carboxyl group terminus.

12. The method of claim 6, wherein the second substrate is a flexible substrate.

13. The method of claim 6, wherein the second substrate is a silicon polymer substrate.

14. The method of claim 6, wherein the first substrate is made of a semiconductor, a metal, glass, or an oxide.

15. A method for fabricating a circuit board, comprising:
    providing a first substrate;
    forming a circuit on the first substrate, the circuit including a first electrode, a second electrode and at least one nanostructure; and
    transferring the circuit from the first substrate to a surface of a second substrate made of a polymer, wherein forming the circuit on the first substrate comprises:
    forming a nonpolar molecular layer pattern on a surface of the first substrate; and
    self-assembling the at least one nanostructure with a region where the first substrate is exposed in the surface of the first substrate.

16. The method of claim 15, wherein forming the circuit on the first substrate further comprises forming the first and the second electrodes on the first substrate.

17. The method of claim 15, wherein the first substrate is immersed into a solution including nanostructures to self-assemble the at least one nanostructure with the exposed region during forming the circuit on the first substrate.

18. The method of claim 17, wherein a bias voltage is applied between the solution and the first substrate during forming the circuit on the first substrate.

19. The method of claim 15, wherein the nonpolar molecular layer pattern is a monolayer pattern including a compound with a methyl terminus.

20. The method of claim 15, wherein the second substrate is a flexible substrate.

21. The method of claim 15, wherein the second substrate is a silicon polymer substrate.

22. The method of claim 15, wherein the first substrate is a substrate made of a semiconductor, a metal, glass or an oxide.

23. A method for fabricating a circuit board, comprising:
    providing a first substrate;
    forming a circuit on the first substrate, the circuit including a first electrode, a second electrode and at least one nanostructure; and
    transferring the circuit from the first substrate to a surface of a second substrate made of a polymer, wherein forming the circuit on the first substrate comprises:
    forming a sacrificial layer pattern on the first substrate;
    providing nanostructures on the first substrate; and
    removing the sacrificial layer pattern to remove nanostructures formed on the sacrificial layer among the provided nanostructures.

24. The method of claim 23, wherein the sacrificial layer pattern is a photoresist pattern.

25. The method of claim 23, further comprising:
    forming a release layer on the first substrate between providing the first substrate and forming the circuit on the first substrate.

26. The method of claim 25, wherein the release layer is a monolayer including a compound with a methyl terminus.

27. The method of claim 23, wherein the second substrate is a flexible substrate.

28. The method of claim 23, wherein the second substrate is a silicon polymer substrate.

29. The method of claim 23, wherein the first substrate is a substrate made of a semiconductor, a metal, glass or an oxide.

* * * * *

UNITED STATES PATENT AND TRADEMARK OFFICE
CERTIFICATE OF CORRECTION

PATENT NO. : 8,245,393 B2  
APPLICATION NO. : 12/234529  
DATED : August 21, 2012  
INVENTOR(S) : Hong et al.

Page 1 of 4

It is certified that error appears in the above-identified patent and that said Letters Patent is hereby corrected as shown below:

Delete figs. 10(b), 16(b), and 24(b) and substitute therefor the drawing sheet, consisting of figs. 10(b), 16(b), and 24(b) as shown on the attached pages.

In Column 4, Line 67, delete "A-A!" and insert -- A-A' --, therefor.

Signed and Sealed this  
Twenty-seventh Day of November, 2012

David J. Kappos  
*Director of the United States Patent and Trademark Office*